US011958780B2

(12) United States Patent
Aitken et al.

(10) Patent No.: US 11,958,780 B2
(45) Date of Patent: *Apr. 16, 2024

(54) RARE-EARTH DOPED METAL OXIDE CERAMIC WAVEGUIDE QUANTUM MEMORIES AND METHODS OF MANUFACTURING THE SAME

(71) Applicant: CORNING INCORPORATED, Corning, NY (US)

(72) Inventors: Bruce Gardiner Aitken, Corning, NY (US); Sean Matthew Garner, Elmira, NY (US); Thomas Dale Ketcham, Horseheads, NY (US); Daniel Aloysius Nolan, Corning, NY (US); Jun Yang, Horseheads, NY (US); Haitao Zhang, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/940,120

(22) Filed: Sep. 8, 2022

(65) Prior Publication Data

US 2023/0019958 A1    Jan. 19, 2023

Related U.S. Application Data

(62) Division of application No. 17/276,856, filed as application No. PCT/US2019/050730 on Sep. 12, 2019, now Pat. No. 11,465,941.

(Continued)

(51) Int. Cl.
| C04B 35/486 | (2006.01) |
| B82Y 40/00 | (2011.01) |
| G11C 13/04 | (2006.01) |

(52) U.S. Cl.
CPC .......... *C04B 35/486* (2013.01); *G11C 13/048* (2013.01); *B82Y 40/00* (2013.01); *C04B 2235/3227* (2013.01)

(58) Field of Classification Search
CPC .................. B82Y 40/00; C04B 35/486; C04B 2235/3227; G11C 13/048
See application file for complete search history.

(56) References Cited

U.S. PATENT DOCUMENTS

| 5,244,485 A ‡ | 9/1993 | Hihara .............. C03B 37/01282 65/427 |
| 5,748,013 A ‡ | 5/1998 | Beauclair .................. H01F 3/14 336/62 |

(Continued)

FOREIGN PATENT DOCUMENTS

| JP | 05-058674 A ‡ | 3/1993 | |
| JP | 2009-081322 A ‡ | 4/2009 | ............. B82Y 10/00 |

(Continued)

OTHER PUBLICATIONS

McMaster-Carr; "Super-Cushioning Polyurethan Foam Sheets, Bars, Cubes, and Strips"; Sheets With Smooth Texture; Downloaded May 14, 2018; 2 Pages.‡

(Continued)

*Primary Examiner* — Michael P Wieczorek
(74) *Attorney, Agent, or Firm* — Svetlana Z. Short

(57) ABSTRACT

A ceramic waveguide includes: a doped metal oxide ceramic core layer; and at least one cladding layer comprising the metal oxide surrounding the core layer, such that the core layer includes an erbium dopant and at least one rare earth metal dopant being: lanthanum, cerium, praseodymium, neodymium, promethium, samarium, europium, gadolinium, terbium, dysprosium, holmium, thulium, ytterbium, lutetium, scandium, or oxides thereof, or at least one non-rare earth metal dopant comprising zirconium or oxides (Continued)

thereof. Also included is a quantum memory including: at least one doped polycrystalline ceramic optical device with the ceramic waveguide and a method of fabricating the ceramic waveguide.

9 Claims, 13 Drawing Sheets

Related U.S. Application Data

(60) Provisional application No. 62/735,400, filed on Sep. 24, 2018.

(56) References Cited

U.S. PATENT DOCUMENTS

| | | | | |
|---|---|---|---|---|
| 6,650,670 | B1 ‡ | 11/2003 | Shimoji | H01S 3/16 372/39 |
| 8,190,553 | B2 ‡ | 5/2012 | Routt | B82Y 10/00 706/62 |
| 9,313,180 | B1 ‡ | 4/2016 | Gray | H04W 12/04 |
| 9,580,650 | B1 ‡ | 2/2017 | Cao | C09K 11/7774 |
| 9,659,651 | B1 ‡ | 5/2017 | Aitken | H01S 3/04 |
| 10,304,536 | B2 ‡ | 5/2019 | Brown | G11C 13/048 |
| 10,553,280 | B2 ‡ | 2/2020 | Brown | H04B 10/70 |
| 11,465,941 | B2 * | 10/2022 | Aitken | C04B 35/486 |
| 2002/0076192 | A1 ‡ | 6/2002 | Bartholomew | C03C 4/0071 501/64 |
| 2005/0065013 | A1 ‡ | 3/2005 | Rosenflanz | C03C 3/155 501/41 |
| 2005/0190637 | A1 ‡ | 9/2005 | Ichimura | B82Y 10/00 365/232 |
| 2006/0163465 | A1 ‡ | 7/2006 | Kuzmich | G21K 1/00 250/251 |
| 2011/0104491 | A1 ‡ | 5/2011 | Shaw | C04B 35/50 428/372 |
| 2011/0222387 | A1 ‡ | 9/2011 | Ham | G02F 1/3515 369/59.1 |
| 2012/0170091 | A1 ‡ | 7/2012 | Goto | B82Y 10/00 359/107 |
| 2013/0107617 | A1 ‡ | 5/2013 | Skold | G11C 13/04 365/162 |
| 2018/0002217 | A1 ‡ | 1/2018 | Boughton | C03B 37/014 |
| 2018/0254085 | A1 * | 9/2018 | Brown | H04B 10/29 |
| 2020/0152268 | A1 ‡ | 5/2020 | Brown | H04B 10/70 |

FOREIGN PATENT DOCUMENTS

| | | | | |
|---|---|---|---|---|
| KR | 10-2010-0016999 A | ‡ | 2/2010 | |
| RU | 2062540 C1 | ‡ | 6/1996 | |
| RU | 2744398 C2 | ‡ | 3/2021 | B82Y 10/00 |
| TW | 1481066 B | ‡ | 4/2015 | |
| WO | WO-2011/036814 A1 | ‡ | 3/2011 | B82Y 10/00 |
| WO | WO-2011/073656 A1 | ‡ | 6/2011 | B82Y 10/00 |
| WO | WO-2015/186656 A1 | ‡ | 12/2015 | C01F 17/00 |

OTHER PUBLICATIONS

Miyoshi, Kazuhisa; "Solid Lubricants and Coatings for Extreme Environments: State-of-the-Art Survey"; NASA/TM-2007-214668; Jan. 2007, 21 Pages.‡

Perrot et al; "Narrow Optical Homogenous Linewidths in Rare Earth Doped Nanocrystals"; Physical Review Letters; 111; 203601; Nov. 15, 2013; pp. 203601-1-203601-5.‡

Saglamyurek et al., "Broadband Waveguide Quantum Memory For Entangled Photons," Nature, vol. 469, Jan. 27, 2011, pp. 512-515.‡

Nilsson et al; "Solid State Quantum Memory Using Complete Absorption and Re-Emission of Photons by Tailored and Externally Controlled Inhomogeneous Absorption Profiles"; Optics Communications; 247; (2005) pp. 393-403.‡

Louchet et al: "Optical Excitation of Nuclear Spin Coherence in Tm3+:YAG", Oct. 17, 2007 (Oct. 17, 2007).‡

Marino et al., "Energy Level Structure and Optical Dephasing under Magnetic Field in Er3+:LiYF4 at 1.5[mu]m", vol. 169, Mar. 14, 2015, pp. 478-482.‡

Kunkel et al., "Dephasing mechanisms of optical transitions in rare-earth-doped transparent ceramics", Physical Review B, vol. 94, 2016, pp. 184301-1-184301-9.‡

Louchet et al: "Branching Ratio Measurement of a "Lambda" System in Tm3+:YAG under magnetic field", Jun. 6, 2006 (Jun. 6, 2006).‡

Tokai Carbon; Grade: EC-15; Isostatically Pressed; 1 Page; Date Unknown.‡

Usmani et al., "Heralded quantum entanglement between two crystals", Nature Photonics, vol. 6, No. 4, Mar. 1, 2012, pp. 234-237.‡

Ferrier et al; "Narrow Inhomogeneous and Homogeneous Optical Linewidths in a Rare Earth Doped Transparent Ceramic"; Physical Review B, vol. 87, 2013, pp. 041102-1-041102-4.‡

Graphtek LLC; Grade: GR008G; Extruded; 1 Page; Date Unknown.‡

Dictionary of Science and Technology; Barnes & Nobel Publishers; Definition of Friction, founded 1873, pp. 488-489.‡

Elert Glenn., "Coefficients of Friction for Teflon", The Physics Factbook, 2004, 3 Pages.‡

Hastings-Simon et al; "Controlled Stark Shifts in Er3+-Doped Crystalline and Amorphous Waveguides for Quantum State Storage"; Optics Communications; 266 (2006); pp. 716-719.‡

Heinze et al: "Stopped Light and Image Storage by Electromagnetically Induced Transparency up to the Regime of One Minute", Jul. 1, 2013 (Jul. 1, 2013).‡

Jobez et al; "Coherent Spin Control at the Quantum Level in an Ensemble-Based Optical Memory"; Physical Review Letters; 114; 230502; Jun. 12, 2015; pp. 230502-1-230502-5.‡

Gruber et al; "Modeling Optical Transitions of Er3+(4f11) in C2 and C3/ Sites in Polycrystalline Y2O3"; Journal of Applied Physics, 104, 023101 (2008); pp. 023101-1-023101-9.‡

Gruber et al; "Spectral Analysis of Synthesized Nanocrystalline Aggregates of ER3+: Y2O3"; Journal of Applied Physics, 101, 113116 (2007); pp. 113116-1-113116-6.‡

Zhang et al., "Transparent Er3+-Doped Y2O3 Ceramics with Long Optical Coherence Lifetime", ACS Omega, vol. 2, 2017, pp. 3739-3744.‡

Zhou et al; "Quantum Storage of Three-Dimensional Orbital-Angular-Momentum Entanglement in a Crystal"; Physical Review Letters; 115; 070502; Aug. 14, 2015; pp. 070502-1-070502-6.‡

Thiel et al., "Optical decoherence studies of yttrium oxyorthosilicate Y2SiO5 codoped with Er3+ and Eu3+ for optical signal processing and quantum information applications at 1.5 microns", Physical Review B, vol. 85, 2012, pp. 174302-1-174302-15.‡

Thiel et al; "Rare-Earth-Doped Materials for Applications in Quantum Information Storage and Signal Processing"; Journal of Luminescence, 131 (2011) pp. 353-361.‡

Welinski et al., "Effects of disorder on optical and electron spin linewidths in Er3+,Sc3+:Y2SiO5", Optical Materials, vol. 63, 2017, pp. 69-75.‡

Saglamyurek et al., "Quantum Storage of Entangled Telecom-Wavelength Photons In an Erbium-Doped Optical Fibre," Nature Photonics vol. 9, Jan. 2015, 10 pages.‡

Sangouard et al; "Quantum Repeaters Based on Atomic Ensembles and Linear Optics"; Rev. Mod. Phys. 83, 33, Mar. 21, 2011; pp. 1-52.‡

Chandra et al., "Synthesis, Morphology, and Optical Characterization of Nanocrystalline Er 3+ : Y 2 0 3", Journal of Physical Chemistry C, vol. 114, No. 2, Jan. 21, 2010, pp. 874-880.‡

Chen et al; "Fault-Tolerant Quantum Repeater With Atomic Ensembles and Linear Optics"; Physical Review A, 76; 022329 (2007); 12 Pages.‡

Chen et al; "Upconversion Emission Enhancement in Yb3+/Er3+-Codoped Y2O3 Nanocrystals by Tridoping With Li+ Ions"; J. Phys. Chem. C.; 2008; 112; pp. 12030-12036.‡

Clausen et al; "Quantum Storage of Photonic Entanglement in a Crystal"; Nature; 469, (2011); pp. 508-511.‡

(56) References Cited

OTHER PUBLICATIONS

Beaudoux et al; "Emission of Photon Echoes in a Strongly Scattering Medium"; Optics Express; vol. 19, No. 16; Aug. 1, 2011; pp. 15236-15243.‡

Böttger et al., "Controlled compositional disorder in $Er^{3+}$:$Y_2SiO_5$ provides a wide-bandwidtspectral hole burning material at 1.5 μm", Physical Review B, vol. 77, 2008, pp. 155125-1-155125-6.‡

"Comparison of Industrial Coating to Improve Performance & Extend Service Life"; Industrial Coatings Comparision for Wear, Corrosion, Release, Lubrication & Friction; Downloaded Jun. 20, 2016; 8 Pages.‡

Afzelius et al; "Multimode Quantum Memory Based on Atomic Frequency Combs"; Phys. Rev. 79, (2009) pp. 1-10.‡

Ma Chaoyang et al: "Fabrication and planar waveguide laser behavior of YAG/Nd:YAG/YAG composite ceramics by tape casting", Journal of Alloys and Compounds, vol. 640, 2015, pp. 317-320.‡

Yang et al: "$Er^{3+}$ doped $Y_2O_3$ transparent ceramic for quantum memory applications", Proc. SPIE 10771, Quantum Communications and Quantum Imaging XVI, 2018, pp. 1077109-1-1077109-8.‡

International Search Report and Written Opinion of the International Searching Authority; PCT/US2019/050730; dated Dec. 12, 2019, 11 pages; European Patent Office.‡

Thiel, C. W., W. R. Babbitt, and R. L. Cone. "Optical decoherence studies of yttrium oxyorthosilicate $Y_2SiO_5$ codoped with $Er^{3+}$ and $Eu^{3+}$ for optical signal processing and quantum information applications at 1.5 microns." Physical Review B 85.17 (2012): 174302. (Year: 2012).‡

\* cited by examiner
‡ imported from a related application

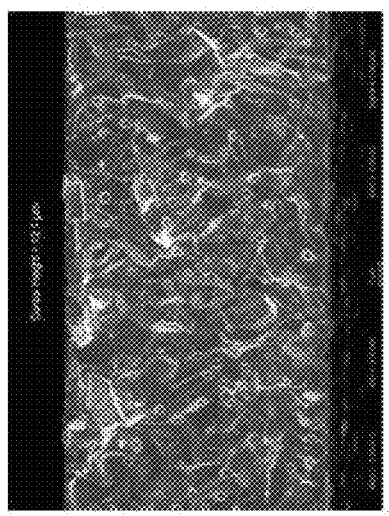 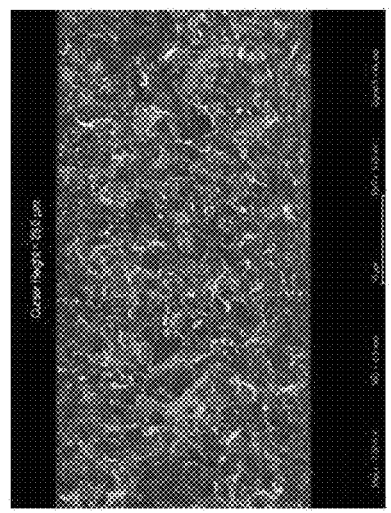
FIG. 12A
FIG. 12B

RARE-EARTH DOPED METAL OXIDE CERAMIC WAVEGUIDE QUANTUM MEMORIES AND METHODS OF MANUFACTURING THE SAME

CROSS-REFERENCE TO RELATED APPLICATION

This application is a continuation of U.S. application Ser. No. 17/276,856 filed on Mar. 17, 2021, which claims the benefit of priority under 35 U.S.C. § 371 of International Application No. PCT/US2019/050730, filed on Sep. 12, 2019, which claims the benefit of priority under 35 U.S.C. § 119 of U.S. Provisional Application Ser. No. 62/735,400 filed on Sep. 24, 2018, the content of which is relied upon and incorporated herein by reference in its entirety.

BACKGROUND

Field

The disclosure relates to rare-earth doped metal oxide ceramic waveguide quantum memories.

Technical Background

In optical quantum information processing, quantum memory devices enable entanglement of photons and atoms, and synchronize quantum processing networks. Currently available, single-crystals and ceramics have been investigated as quantum memory materials, and specifically rare earth-doped solids, due to narrow 4f-4f transitions of the rare earth ions and a long optical coherence lifetime, on the order of tens of microseconds.

Transparent ceramic single-mode waveguides are desired platforms for optical quantum memories. Such waveguide structures offer advantages such as low insertion loss, simple packaging and device stability. However, fabrication procedures for these ceramic waveguide quantum memories is challenging, with one major barrier being the addition of index modifiers which often reduces optical coherence lifetime. Moreover, single crystal waveguides are cost prohibitive in quantum memory applications.

This disclosure presents improved polycrystalline rare-earth doped metal oxide ceramic waveguide quantum memories and methods of manufacturing thereof.

SUMMARY

In some embodiments, a ceramic waveguide, comprises: a doped metal oxide ceramic core layer; and at least one cladding layer comprising the metal oxide surrounding the core layer, wherein the core layer includes an erbium dopant and at least one rare earth metal dopant, comprising: lanthanum, cerium, praseodymium, neodymium, promethium, samarium, europium, gadolinium, terbium, dysprosium, holmium, thulium, ytterbium, lutetium, scandium, or oxides thereof, or at least one non-rare earth metal dopant comprising zirconium or oxides thereof.

In one aspect, which is combinable with any of the other aspects or embodiments, the core layer comprises an erbium dopant and a lanthanum dopant, and the erbium dopant is $Er^{3+}$ and the lanthanum dopant is $La^{3+}$.

In one aspect, which is combinable with any of the other aspects or embodiments, the core layer comprises an erbium dopant and a lutetium dopant, and the erbium dopant is $Er^{3+}$ and the lutetium dopant is $Lu^{3+}$.

In one aspect, which is combinable with any of the other aspects or embodiments, the core layer comprises an erbium dopant and a gadolinium dopant, and the erbium dopant is $Er^{3+}$ and the gadolinium dopant is $Gd^{3+}$.

In one aspect, which is combinable with any of the other aspects or embodiments, the core layer comprises an erbium dopant and a scandium dopant, and the erbium dopant is $Er^{3+}$ and the scandium dopant is $Sc^{3+}$.

In one aspect, which is combinable with any of the other aspects or embodiments, the at least one cladding layer a refractive index that is lower than a refractive index of the core layer.

In one aspect, which is combinable with any of the other aspects or embodiments, photons traversing the core layer are configured to undergo total internal reflection at a boundary between the core layer and the at least one cladding layer.

In one aspect, which is combinable with any of the other aspects or embodiments, the core layer has an average grain size in a range of 1 μm² to 500 μm².

In one aspect, which is combinable with any of the other aspects or embodiments, the metal oxide is selected from yttrium oxide ($Y_2O_3$), hafnium oxide ($HfO_2$), zirconium oxide ($ZrO_2$), or combinations thereof.

In one aspect, which is combinable with any of the other aspects or embodiments, the metal oxide is yttrium oxide ($Y_2O_3$); and the core layer is configured to have a refractive index ($n_1$) greater than a refractive index of $Y_2O_3$ ($n_2$) such that $n_1$-$n_2$ is in a range of 0.001/molar % to 0.009/molar %.

In some embodiments, a quantum memory, comprises: at least one doped polycrystalline ceramic optical device with a ceramic waveguide having: a doped yttrium oxide ($Y_2O_3$) ceramic core layer; and at least one cladding layer comprising $Y_2O_3$ surrounding the core layer, wherein the core layer includes an erbium dopant and at least one rare earth metal dopant, comprising: lanthanum, cerium, praseodymium, neodymium, promethium, samarium, europium, gadolinium, terbium, dysprosium, holmium, thulium, ytterbium, lutetium, scandium, or oxides thereof, or at least one non-rare earth metal dopant comprising zirconium or oxides thereof.

In some embodiments, a method of fabricating a ceramic waveguide, comprises: reacting an organic precursor, at least one transition metal complex, and a plurality of rare-earth metal complexes to form a plurality of rare-earth doped crystalline nanoparticles; sintering the plurality of rare-earth doped nanoparticles to form a doped polycrystalline ceramic substrate; disposing a transition metal ceramic slurry over the doped polycrystalline ceramic substrate; and sintering the slurry to bond the transition metal ceramic to the doped polycrystalline ceramic substrate.

In one aspect, which is combinable with any of the other aspects or embodiments, the plurality of rare-earth doped crystalline nanoparticles each comprise a diameter of 40 nm or less.

In one aspect, which is combinable with any of the other aspects or embodiments, the step of reacting comprises: providing an organic precursor solution; providing a metal salt solution comprising at least one transition metal complex and a plurality of rare-earth metal complexes; and mixing the organic precursor solution with the metal salt solution at a boiling point of a solvent in the metal salt solution to form a mixture.

In one aspect, which is combinable with any of the other aspects or embodiments, the step of reacting further comprises: filtering the mixture to form a plurality of amorphous nanoparticle precursors; annealing the plurality of amorphous nanoparticle precursors to form the plurality of rare-earth doped crystalline nanoparticles.

In one aspect, which is combinable with any of the other aspects or embodiments, the organic precursor is urea, the at least one transition metal complex comprises yttrium, and the plurality of rare-earth metal complexes comprises erbium and at least one of: lanthanum, cerium, praseodymium, neodymium, promethium, samarium, europium, gadolinium, terbium, dysprosium, holmium, thulium, ytterbium, lutetium, scandium or oxides thereof.

In one aspect, which is combinable with any of the other aspects or embodiments, the step of sintering the plurality of rare-earth doped nanoparticles comprises: a first cold isostatic pressing of the plurality of rare-earth doped crystalline nanoparticles into a pellet; sintering the pellet at a temperature of at least 1450° C.; and a second hot isostatic pressing of the pellet under inert atmosphere to form the doped polycrystalline ceramic substrate.

In one aspect, which is combinable with any of the other aspects or embodiments, the step of disposing comprises: spin coating or tape casting the transition metal ceramic slurry over the doped polycrystalline ceramic substrate to a thickness in a range of 100 μm to 1 cm.

In one aspect, which is combinable with any of the other aspects or embodiments, the step of sintering the slurry comprises: removing volatile material from the slurry to bond the transition metal ceramic to the doped polycrystalline ceramic substrate, wherein sintering decreases a thickness of the transition metal ceramic by at least 30%, as compared with a thickness of the disposed transition metal ceramic slurry.

In one aspect, which is combinable with any of the other aspects or embodiments, the volatile material includes at least one of solvent, binder, and plasticizer.

BRIEF DESCRIPTION OF THE DRAWINGS

The disclosure will become more fully understood from the following detailed description, taken in conjunction with the accompanying figures, in which:

FIG. 6A depicts the average grain area of $Y_2O_3$; FIG. 6B depicts the average grain area of $La^{3+}$-doped (1%) $Y_2O_3$; and FIG. 6C depicts the average grain area of $La^{3+}$-doped (4%) $Y_2O_3$. The scale bar is 100 μm in FIGS. 6A and 6B and 10 μm in FIG. 6C.

FIGS. 12A and 12B illustrate a sintered single layer of $Y_2O_3$ and a sintered double layer of $Y_2O_3$, respectively, according to some embodiments.

DETAILED DESCRIPTION

Figure 1:
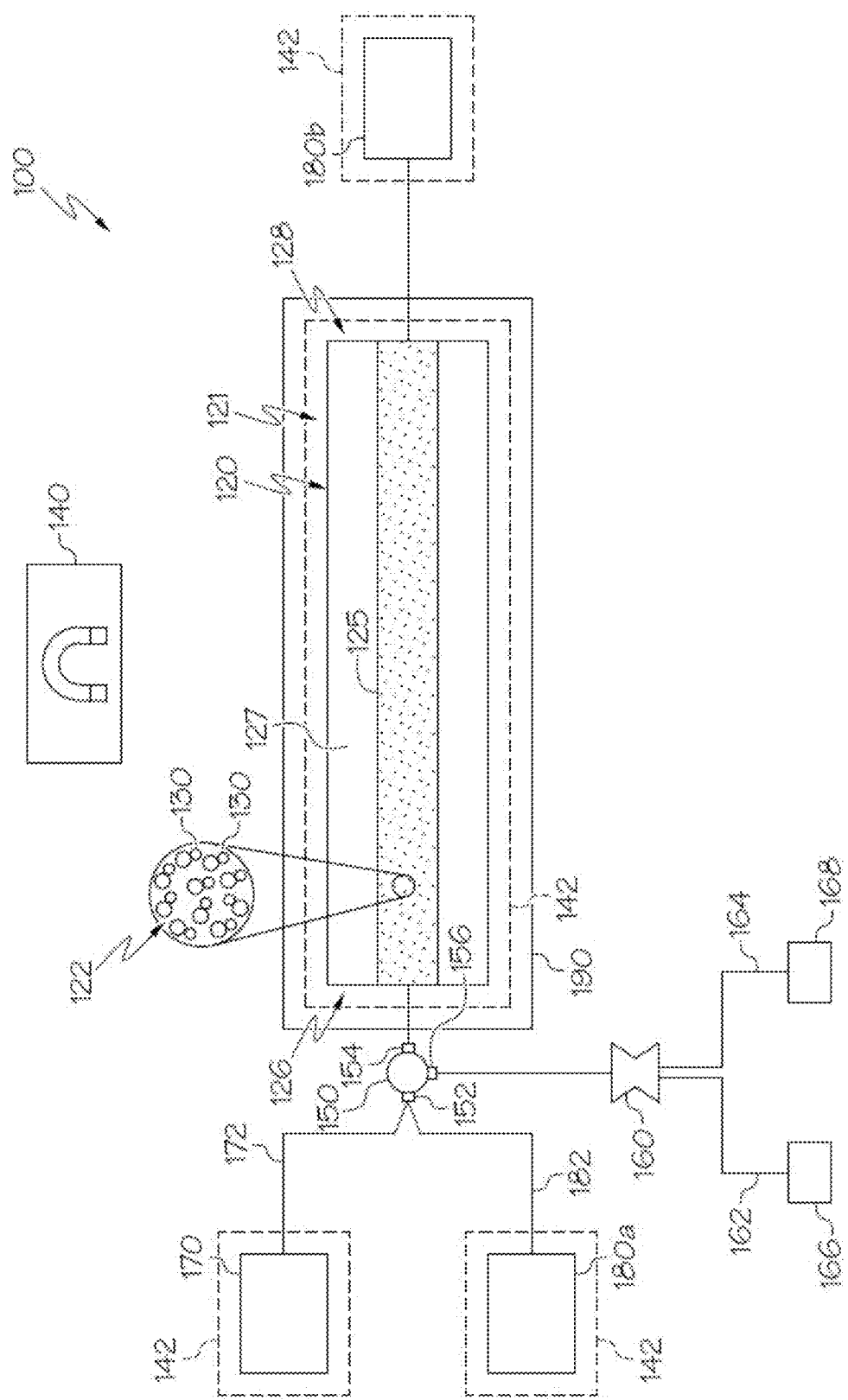
FIG. 1 is a schematic illustration of a quantum memory system having a doped polycrystalline ceramic optical device with rare-earth element dopants, according to some embodiments.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments. It should be understood that the present application is not limited to the details or methodology set forth in the description or illustrated in the figures. It should also be understood that the terminology is for the purpose of description only and should not be regarded as limiting.

Additionally, any examples set forth in this specification are illustrative, but not limiting, and merely set forth some of the many possible embodiments of the claimed invention. Other suitable modifications and adaptations of the variety of conditions and parameters normally encountered in the field, and which would be apparent to those skilled in the art, are within the spirit and scope of the disclosure.

This disclosure presents a new method for tuning optical refractive index of $Er^{3+}$ doped metal oxide transparent ceramics without decreasing the optical coherence lifetime of $Er^{3+}$ $^4I_{13/2}$-$^4I_{15/2}$ transitions. In some examples, at least one rare-earth metal dopant (e.g., lanthanum ($La^{3+}$), cerium ($Ce^{3+}$), praseodymium ($Pr^{3+}$), neodymium ($Nd^{3+}$), promethium ($Pm^{3+}$), samarium ($Sm^{3+}$), europium ($Eu^{3+}$), gadolinium ($Gd^{3+}$), terbium ($Tb^{3+}$), dysprosium ($Dy^{3+}$), holmium ($Ho^{3+}$), thulium ($Tm^{3+}$), ytterbium ($Yb^{3+}$), lutetium ($Lu^{3+}$), scandium ($Sc^{3+}$)) or oxides thereof may be used as index modifiers to increase the refractive index of metal oxide ceramics. In some examples, at least one non-rare earth metal dopant (e.g., zirconium ($Zr^{3+}$, $Zr^{4+}$)) or oxides thereof may be used as index modifiers to increase the refractive index of metal oxide ceramics.

In some examples, erbium ($Er^{3+}$) and at least one rare-earth metal dopant, at least one non-rare earth metal dopant, oxides thereof, or combinations thereof are doped into metal oxide through a solution synthesis of doped metal oxide nanoparticles. The nanoparticles may be used to prepare transparent, co-doped metal oxide ceramics, and ceramic waveguides comprising a co-doped metal oxide ceramic core and at least one cladding layer comprising metal oxide surrounding the core. The index modifier may be any dopant which does not have energy interactions with $Er^{3+}$ ions.

FIG. 1 is a schematic illustration of quantum memory system 100. The quantum memory system 100 comprises a doped polycrystalline ceramic optical device 120, a magnetic field generation unit 140, a storage photon generator 170, and one or more pump lasers 180, for example a first pump laser 180a and a second pump laser 180b. As described below, the quantum memory system 100 is structurally configured to store and release one or more storage photons, for example, on demand, such that the quantum memory system 100 may be synchronized with one or more additional quantum memory systems to form a quantum repeater system. Further, the components of the quantum memory system 100, for example, the doped polycrystalline ceramic optical device 120 may be positioned in an optical system that includes one or more quantum repeater systems each comprising a pair of doped polycrystalline ceramic optical devices 120. The optical system including the one or more quantum repeater systems may be structurally configured to entangle a pair of storage photons that are each stored and released by the doped polycrystalline ceramic optical devices 120 of the respective quantum memory systems. Moreover, the quantum memory system 100 and the optical system described herein may be incorporated into one or more quantum communications systems, for example, quantum key generation systems, quantum telecommunications systems, quantum internet systems, and any other current or yet-to be developed quantum communications systems.

As depicted in FIG. 1, the doped polycrystalline ceramic optical device 120 of the quantum memory system 100 includes a crystal lattice 122 and is doped with at least one rare-earth element dopant 130 that is uniformly distributed within the crystal lattice 122 of the doped polycrystalline ceramic optical device 120.

As used herein, "uniform distribution" refers to a distribution of a dopant within a crystal lattice, such as the rare-earth element dopant 130, in which at least 50% (and preferably 75% or more) of the dopant is doped into grains of the crystal lattice at locations apart from the grain boundaries of the crystal lattice.

The doped polycrystalline ceramic optical device 120 comprises a first end 126 and a second end 128, which may be opposite the first end 126. The doped polycrystalline ceramic optical device 120 may comprise a metal oxide formed into a polycrystalline ceramic, such as yttrium oxide, zirconium oxide, hafnium oxide or the like, or combinations thereof. For example, the doped polycrystalline ceramic optical device 120 may comprise a combination of yttrium oxide and zirconium oxide. In some examples, the doped polycrystalline ceramic optical device 120 may comprise a combination of zirconium oxide and hafnium oxide where hafnium oxide comprises about 2-10% of a total molecular weight of the doped polycrystalline ceramic optical device 120, for example, 4%, 6%, 8%, or the like. Further, the doped polycrystalline ceramic optical device 120 may be transparent.

As depicted in FIG. 1, the doped polycrystalline ceramic optical device 120 may comprise a doped polycrystalline ceramic optical waveguide 121 having a polycrystalline ceramic core 125 and a cladding 127 surrounding the polycrystalline ceramic core 125. The cladding 127 comprises a refractive index that is lower than a refractive index of the polycrystalline ceramic core 125 such that photons traversing the polycrystalline ceramic core 125 undergo total internal reflection at the core-cladding boundary between polycrystalline ceramic core 125 and the cladding 127. When the difference between the refractive indices of the polycrystalline ceramic core 125 and the cladding 127 is small, a larger polycrystalline ceramic core 125 (relative to the cladding 127) may be desired and when there the difference between the refractive indices of the polycrystalline ceramic core 125 and the cladding 127 is large, a smaller polycrystalline ceramic core 125 (relative to the cladding 127) may be desired.

Further, the polycrystalline ceramic core 125 may comprise a metal oxide, for example, yttrium oxide, zirconium oxide, hafnium oxide or the like, or combinations thereof formed into a polycrystalline ceramic. Further, the cladding 127 may comprise a polymer, for example, a UV durable polymer, a polymer in an organic matrix, or any other known or yet to be developed polymer suitable as a cladding. In some examples, the polycrystalline ceramic core 125 comprises yttrium oxide and the cladding 127 comprises a polymer. Alternatively, the cladding 127 may comprise a polycrystalline ceramic for example, a metal oxide, for example, yttrium oxide and/or zirconium oxide formed into a polycrystalline ceramic. In some examples, the polycrystalline ceramic core 125 may comprise a combination of yttrium oxide, and zirconium oxide and the cladding 127 may comprise yttrium oxide. In some examples, the polycrystalline ceramic core 125 may comprise yttrium oxide and the cladding 127 may also comprise yttrium oxide. Moreover, the polycrystalline ceramic core 125 of the doped polycrystalline ceramic optical waveguide 121 is doped with at least one rare-earth element dopant 130 that is uniformly distributed within a crystal lattice 122 of the polycrystalline ceramic core 125. Further, while the doped polycrystalline ceramic optical device 120 is depicted as the doped polycrystalline ceramic optical waveguide 121 in FIG. 1, it should be understood that the doped polycrystalline ceramic optical device 120 may comprise any optical device, for example, optical devices that do not include a core and a cladding.

Further, the doped polycrystalline ceramic optical device 120 may comprise a variety of shapes and sizes to facilitate photon absorption and release. For example, the doped polycrystalline ceramic optical device 120 may comprise a length extending between the first end 126 and the second end 128 that is between about 1 cm and about 50 cm, for example, 5 cm, 10 cm, 15 cm, 20 cm, 30 cm, 40 cm, or the like. Further, the doped polycrystalline ceramic optical device 120 and may comprise a cross sectional area of between about 0.0001 $mm^2$ and about 25 $mm^2$, for example, about 0.0001 $mm^2$, 0.0005 $mm^2$, 0.001 $mm^2$, 0.005 $mm^2$, 0.01 $mm^2$, 0.05 $mm^2$, 0.1 $mm^2$, 0.5 $mm^2$, 1 $mm^2$, 2 $mm^2$, 5 $mm^2$, 10 $mm^2$, 15 $mm^2$, 20 $mm^2$, or the like. Moreover, the doped polycrystalline ceramic optical device 120 may comprise a width of between about 0.01 mm and 5 mm, such as 0.01 mm, 0.05 mm, 0.1 mm, 0.5 mm, 0.75 mm, 1 mm, 2 mm, 3 mm, 4 mm, or the like, and a height of between about 0.01 mm and about 5 mm, such as 0.01 mm, 0.05 mm, 0.1 mm, 0.5 mm, 0.75 mm, 1 mm, 2 mm, 3 mm, 4 mm, or the like. The doped polycrystalline ceramic optical device 120 may also comprise an optical cavity positioned within the doped polycrystalline ceramic optical device 120. In operation, the optical cavity may trap light, such as a storage photon, within the optical cavity until the light is absorbed, for example, absorbed by the rare-earth element dopant 130 located within.

The rare-earth element dopant 130 doped into the crystal lattice 122 of the doped polycrystalline ceramic optical device 120 includes one or more rare-earth elements, for example, one or more lanthanide elements, including erbium, thulium, praseodymium, lanthanum, cerium, neodymium, samarium, europium, gadolinium, terbium, dysprosium, holmium, ytterbium, and lutetium, or the like, as well non-lanthanide elements such as scandium, and oxides of each of these lanthanide and non-lanthanide rare-earth elements. Further, the rare-earth element dopant 130 may comprise between about 0.01% and about 2% of the total molecular weight of doped polycrystalline ceramic optical device 120, for example, 0.025%, 0.05%, 0.075%, 0.1%, 0.125%, 0.15%, 0.2%, 0.25%, 0.5%, 0.75%, 1.0%, 1.25%, 1.5%, 1.75%, or the like. In some examples, the rare-earth element dopant 130 comprises between about 0.05% to about 0.15% of a total molecular weight of the doped polycrystalline ceramic optical device 120.

The rare-earth element dopant 130 doped into the crystal lattice 122 of the doped polycrystalline ceramic optical device 120 may include a shaped spectral structure positioned within the rare-earth element dopant 130, the shaped spectral structure comprising a superposition (e.g., of one or more electrons of the rare-earth element dopant 130) that is transferable between a plurality of energy states. For example, as explained in more detail below, one or more pump lasers 180 may irradiate the doped polycrystalline ceramic optical device 120 to generate the shaped spectral structure within the rare-earth element dopant 130. In operation, the superposition of the shaped spectral structure is transferrable between energy states, for example, when the doped polycrystalline ceramic optical device 120 receives one or more storage photons emitted by the storage photon generator 170 and/or one or more pump pulses emitted by the one or more pump lasers 180, as described in more detail below. In operation, ions of rare-earth elements have narrow 4f-4f transitions and have long optical coherence, which makes them suitable for transferring the superposition of the shaped spectral structure between energy states to store the storage photon within the rare-earth element dopant 130. Moreover, the doped polycrystalline ceramic optical device 120 may also be doped with non-rare-earth element dopants, such as oxides of Mg, Ca, Sc, Ti, V, Nb, Ta, Mo, W, Sn, and In.

Further, the doped polycrystalline ceramic optical device 120 may formed by sintering a plurality of rare-earth doped nanoparticles 110. The plurality of rare-earth doped nanoparticles 110 may comprise $Er^{3+}$ doped $Y_2O_3$ nanoparticles. The plurality of rare-earth doped nanoparticles 110 may be formed my mixing a plurality of transition metal complexes 112, a plurality of rare-earth metal complexes 114, an organic precursor 116, and water, such as deionized water (FIGS. 3A-3E). For example, by doping $Er^{3+}$ ions into nanoparticles, such as, $Y_2O_3$ nanoparticles, using a solution phase synthesis (e.g., using the methods described below with respect to FIGS. 3A-3E) the doped polycrystalline ceramic optical device 120 formed by sintering these rare-earth doped nanoparticles 110 may comprise atomically homogenously distributed rare earth ions (e.g., $Er^{3+}$ ions).

The plurality of transition metal complexes 112 may be metal salts such as metal chlorides or metal nitrates, including zirconium salts, yttrium salts or combinations thereof. Further, the plurality of rare-earth metal complexes 114 may comprise metal complexes, for example, metal salts, of any of the rare-earth elements described above. By using rare-earth metal complexes 114 form the plurality of rare-earth doped nanoparticles 110 (e.g., diameters of 200 nm or less) the rare-earth element dopant 130 positioned within resultant doped polycrystalline ceramic optical device 120 may be more uniformly distributed within the crystal lattice 122 of the doped polycrystalline ceramic optical device 120, improving performance of the doped polycrystalline ceramic optical device 120. Moreover, the organic precursor 116 may comprise urea, ammonium hydroxide, or the like.

Referring again to FIG. 1, the storage photon generator 170 is optically coupled to the doped polycrystalline ceramic optical device 120, for example, to the first end 126 or the second end 128 of the doped polycrystalline ceramic optical device 120, and is structurally configured to generate and emit a storage photon, for example, an entangled storage photon or a non-entangled storage photon. The storage photon generator 170 comprises a photon source, for example, a laser, a laser optically coupled to a non-linear crystal, a parametric down convertor, or the like. Further, the storage photon generator 170 may generate and emit storage photons using a four-wave mixing process, or any method or process of generating photons.

In operation, the storage photon generator 170 may generate and emit storage photons having any wavelength, for example, between about 300 nm and about 10 μm, for example, 500 nm, 1550 nm, 2200 nm, or the like. As a non-limiting example, the storage photon emitted by the storage photon generator 170 may comprise a first entangled storage photon that is entangled with a second entangled storage photon simultaneously emitted by the storage photon generator 170. In operation, the first entangled storage photon may traverse the doped polycrystalline ceramic optical device 120 and the second entangled storage photon may travel along a pathway separate from the doped polycrystalline ceramic optical device 120 while remaining entangled with the first entangled storage photon.

Referring still to FIG. 1, the storage photon generator 170 may be optically coupled to the doped polycrystalline ceramic optical device 120 using a storage photon transmission fiber 172 or other waveguide device, which may extend between the storage photon generator 170 and the first or second end 126, 128 of the doped polycrystalline ceramic optical device 120. Further, the storage photon generator 170 may be optically coupled to the first or second end 126, 128 of the doped polycrystalline ceramic optical device 120 by aligning the storage photon generator 170 with the first end 126 or the second end 128, for example, using one or more alignment mechanisms 142 structurally configured to optically align the storage photon generator 170 with the doped polycrystalline ceramic optical device 120. The one or more alignment mechanisms 142 may comprise an alignment stage, an optical switch, or both. Further, the storage photon generator 170 and/or the doped polycrystalline ceramic optical device 120 may be coupled to individual alignment mechanisms 142.

The one or more pump lasers 180 are optically coupled to the doped polycrystalline ceramic optical device 120 and are each structurally configured to generate and emit pump pulses. The one or more pump lasers 180 may comprise any laser source, for example, a diode laser, an external cavity diode laser, a fiber laser, a dye laser, or the like. Further, the one or more pump lasers 180 may be structurally configured to emit pump pulses having any wavelength, for example, between about 500 nm and about 2200 nm. Moreover, the wavelength of the pump pulses generated and emitted by the one or more pump lasers 180 may be larger than the wavelength of the storage photons generated and emitted by the storage photon generator 170.

Further, as depicted in FIG. 1, the one or more pump lasers 180 may comprise a first pump laser 180a and a second pump laser 180b. For example, the first pump laser 180a may be optically coupled to the first end 126 of the doped polycrystalline ceramic optical device 120 and the second pump laser 180b may be optically coupled to the second end 128 of the doped polycrystalline ceramic optical device 120. As depicted in FIG. 1, the first pump laser 180a may be optically coupled to the same end of the doped polycrystalline ceramic optical device 120 as the storage photon generator 170 (e.g., the first end 126) and the second pump laser 180b may be optically coupled to a different end of the doped polycrystalline ceramic optical device 120 as the storage photon generator 170 (e.g., the second end 128). Optically coupling the first and second pump lasers 180a, 180b to different ends of the doped polycrystalline ceramic optical device 120 may decrease optical scattering within the doped polycrystalline ceramic optical device 120 of the storage photon during operation of the quantum memory system 100.

As depicted in FIG. 1, each pump laser 180 may be optically coupled to the doped polycrystalline ceramic optical device 120 using a pump pulse transmission fiber 182 or other waveguide device, which may extend between each pump laser 180 and the doped polycrystalline ceramic optical device 120. Further, each pump laser 180 may be optically coupled to the doped polycrystalline ceramic optical device 120 using one or more alignment mechanisms 142 structurally configured to optically align each pump laser 180 with the doped polycrystalline ceramic optical device 120. The one or more alignment mechanisms 142 may comprise an alignment stage, an optical switch, or both. Further, the one or more pump lasers 180 and/or the doped polycrystalline ceramic optical device 120 may be coupled to individual alignment mechanisms 142.

Referring again to FIG. 1, the quantum memory system 100 may further comprise a wavelength division multiplexer (WDM) 160 optically coupled to the doped polycrystalline ceramic optical device 120. In particular, the WDM 160 is optically coupled to the end of the doped polycrystalline ceramic optical device 120 where the storage photon exits the doped polycrystalline ceramic optical device 120. For example, as depicted in FIG. 1, the WDM 160 may be optically coupled to the first end 126 of the doped polycrystalline ceramic optical device 120. Further, the WDM 160 may be optically coupled to both a storage photon pathway 162 and a pump pulse pathway 164, for example, the WDM 160 may be positioned between an end (e.g., the first end 126) of the doped polycrystalline ceramic optical device 120 and both the storage photon pathway 162 and the pump pulse pathway 164. The WDM 160 is configured to direct the storage photons into the storage photon pathway 162 and direct the pump pulses into the pump pulse pathway 164. For example, the WDM 160 may direct a wavelength range of photons encompassing the wavelengths of the storage photons into the storage photon pathway 162 and may direct a wavelength range of photons encompassing the wavelengths of the pump pulses into the pump pulse pathway 164. Further, the storage photon pathway 162 and the pump pulse pathway 164 may comprise optical fibers.

The storage photon pathway 162 may extend between the WDM 160 and a storage photon receiver 166. Further, the pump pulse pathway 164 may extend between the WDM 160 and a pump pulse receiver 168. In operation, the first and second pump pulses may terminate at the pump pulse receiver 168, for example, the pump pulse receiver 168 may comprise a fiber end in embodiments in which the pump pulse pathway 164 comprises an optical fiber.

Referring still to FIG. 1, the quantum memory system 100 may further comprise an optical circulator 150 optically coupled the doped polycrystalline ceramic optical device 120, for example, to the first end 126 of the doped polycrystalline ceramic optical device 120. The optical circulator 150 comprises three or more optical ports, for example, a first optical port 152, a second optical port 154, and a third optical port 156. Further, the optical circulator 150 is positioned between the storage photon generator 170 and the doped polycrystalline ceramic optical device 120, for example, the first end 126 of the doped polycrystalline ceramic optical device 120 such that a first optical port 152 of the optical circulator 150 is optically coupled to the storage photon generator 170 and the second port is optically coupled to the first end 126 of the doped polycrystalline ceramic optical device 120.

The optical circulator 150 may also be positioned between at least one of the pump lasers 180 (e.g., the first pump laser 180a) and the first end 126 of the doped polycrystalline ceramic optical device 120 such that the first optical port 152 of the optical circulator 150 is optically coupled to at least one of the one or more pump lasers 180 and the second optical port 154 is optically coupled to the first end 126 of the doped polycrystalline ceramic optical device 120. For example, as depicted in FIG. 1, the storage photon generator 170 and the first pump laser 180a are each optically coupled to the first optical port 152 of the optical circulator 150 such that storage photons output by the storage photon generator 170 and the first pump pulse output by the first pump laser 180a enter the first optical port 152 of the optical circulator 150 and exit the second optical port 154 towards the first end 126 of the doped polycrystalline ceramic optical device 120.

The optical circulator 150 may also be positioned between the WDM 160 and the doped polycrystalline ceramic optical device 120, for example, the first end 126 of the doped polycrystalline ceramic optical device 120. Further, the third optical port 156 of the optical circulator 150 is optically coupled to the WDM 160. For example, the WDM 160 is positioned adjacent and optically coupled to the third optical port 156 of the optical circulator 150 such that the WDM 160 receives the storage photon after the storage photon exits the first end 126 of the doped polycrystalline ceramic optical device 120 and may receive one or both of the pump pulses output by the first and second pump lasers 180a, 180b.

As depicted in FIG. 1, the quantum memory system 100 may further comprise a cooling system 190 thermally coupled to the doped polycrystalline ceramic optical device 120. As a non-limiting example, the cooling system 190 may comprise a cooling chamber and the doped polycrystalline ceramic optical device 120 may be positioned within the cooling chamber. As another non-limiting example, the cooling system 190 may comprise a laser cooling system and the doped polycrystalline ceramic optical device 120 may be optically coupled to the laser cooling system. It should be understood that any cooling system 190 structurally configured to cool the doped polycrystalline ceramic optical device 120 is contemplated.

Referring still to FIG. 1, the magnetic field generation unit 140 may comprise any magnetic device structurally and compositionally configured to generate a magnetic field, for example, a static magnetic field. As non limiting examples, the magnetic field generation unit 140 may comprise an electromagnet, a ferromagnet, an alcnico magnet, a samarium cobalt (SmCo) magnet, a neodymium iron boron (NdFeB) magnet, or combinations thereof. Further, the magnetic field generation unit 140 is positioned within the quantum memory system 100 such that, when the magnetic field generation unit 140 generates a magnetic field, the doped polycrystalline ceramic optical device 120 is positioned within the magnetic field of the magnetic field generation unit 140. For example, the magnetic field generation unit 140 may be adjacent the doped polycrystalline ceramic optical device 120. As a non-limiting example, the magnetic field generation unit 140 may be structurally and compositionally configured to generate a magnetic field comprising a magnetic flux density of between about 0.2 tesla and about 5 tesla, such as about 0.4 tesla, 0.5 tesla, 0.6 tesla, 0.65 tesla, 0.7 tesla, 0.8 tesla, 1 tesla, 2 tesla, 2.5 tesla, 3 telsa, 4 tesla, or the like.

Figure 2:
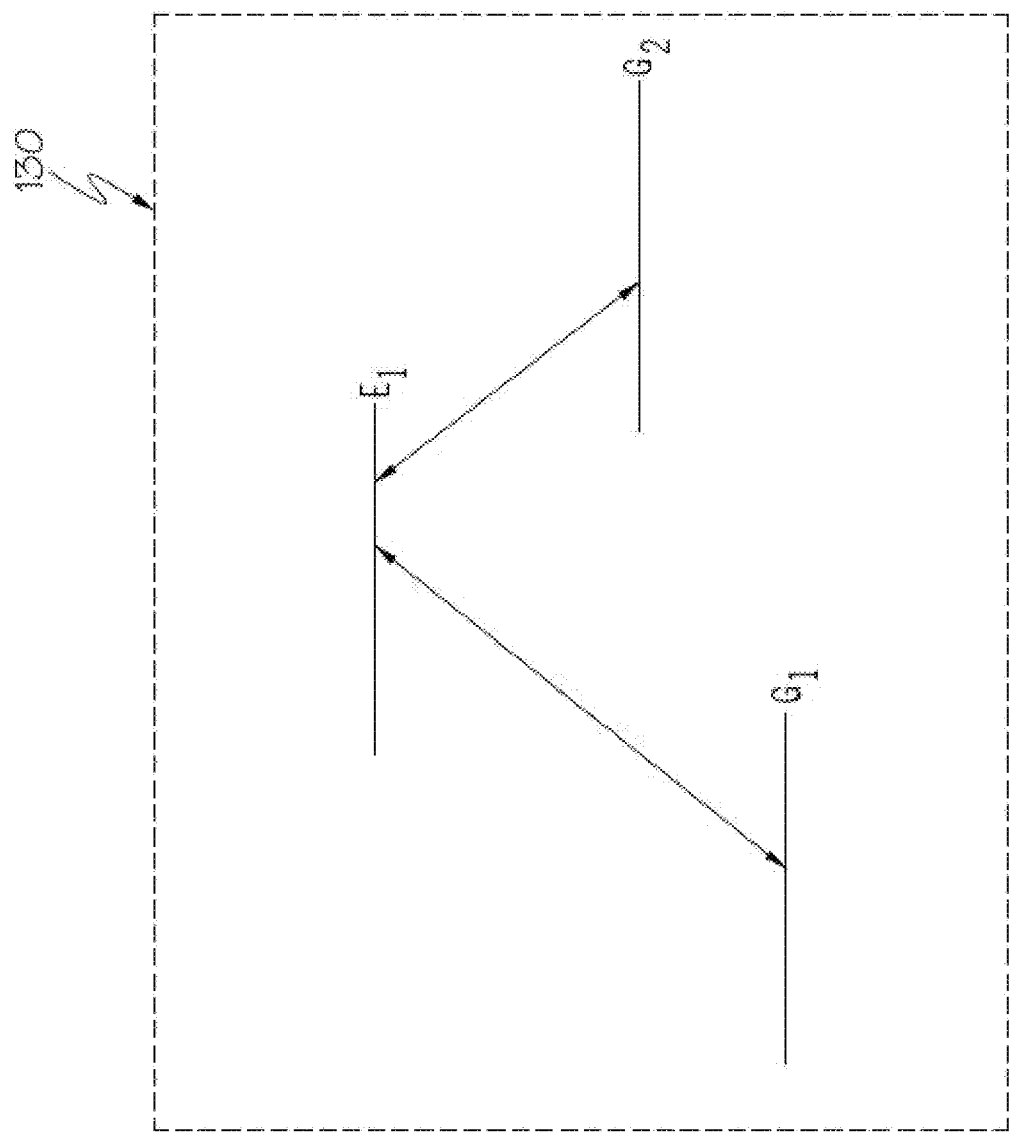
FIG. 2 is a schematic illustration of ground and excited energy states of a superposition of a shaped spectral structure of the rare-earth element dopants of FIG. 1, according to some embodiments.

As schematically depicted in FIG. 2, when the doped polycrystalline ceramic optical device 120 is positioned within the magnetic field of the magnetic field generation unit 140 and the one or more pump lasers 180 have irradiated the doped polycrystalline ceramic optical device 120 to generate the shaped spectral structure within the rare-earth element dopant 130, a ground state of the superposition of the shaped spectral structure of the rare-earth element dopant 130 is split such that each superposition of the shaped spectral structure of the rare-earth element dopant 130 comprises a first split ground state $G_1$, a second split ground state $G_2$ and an excited energy state $E_1$. By splitting the ground state of the superposition of the shaped spectral structure of the rare-earth element dopant 130, the superposition of the shaped spectral structure may be transferred into the second ground state $G_2$ to store the storage photon within the doped polycrystalline ceramic optical device 120, as described below.

In operation, the doped polycrystalline ceramic optical device 120 doped with the at least one rare-earth element dopant 130 is structurally and compositionally configured to absorb and store a storage photon emitted by the storage photon generator 170. For example, the shaped spectral structure may be generated in the doped polycrystalline ceramic optical device 120, for example, in the rare-earth element dopant 130, using one or more pump pulses output by the pump laser 180. For example, the shaped spectral structure may comprise an atomic frequency comb (AFC), controlled reversible inhomogeneous broadening (CRIB), or any known or yet-to-be developed shaped spectral structure, for example, shaped spectral structures formed by using spectral hole burning.

Next, when the storage photon is traversing the doped polycrystalline ceramic optical device 120, the storage photon may transfer the superposition of the shaped spectral structure of the rare-earth element dopant 130 from the first split ground state $G_1$ to the excited energy state $E_1$, as schematically shown in FIG. 2, to absorb the storage photon. Next, upon receipt of a first pump pulse output by the first pump laser 180a, the first pump pulse may transfer the superposition of the shaped spectral structure of the rare-earth element dopant 130 from the excited energy state $E_1$ into the second split ground state $G_2$, to store the storage photon. Moreover, the output from the pump laser may comprise a it-pulse.

Further, the doped polycrystalline ceramic optical device 120 doped with the rare-earth element dopant 130 is structurally and compositionally configured to release, on demand, the storage photon stored within the doped polycrystalline ceramic optical device 120. For example, upon receipt of a second pump pulse output by the second pump laser 180b, the superposition of the shaped spectral structure of the rare-earth element dopant 130 is transferred from the second split ground state $G_2$ back to the excited energy state $E_1$. Once in the excited energy state $E_1$, the superposition of the shaped spectral structure of the rare-earth element dopant 130 will automatically release the storage photon after a delay period, such that the storage photon exits the doped polycrystalline ceramic optical device 120, for example, the first end 126 of the doped polycrystalline ceramic optical device 120. For example, once in the excited energy state $E_1$, the shaped spectral structure of the rare-earth element dopant 130 will rephase, and after the delay period, the storage photon will exit the doped polycrystalline ceramic optical device 120. Moreover, the storage photon may exit the first end 126 of the doped polycrystalline ceramic optical device 120 when the second pump laser 180b emits the second pump pulse into to the second end 128 of the doped polycrystalline ceramic optical device 120 and the storage photon may exit the second end 128 of the doped polycrystalline ceramic optical device 120 when the second pump laser 180b emits the second pump pulse into the first end 126 of the doped polycrystalline ceramic optical device 120.

The delay period comprises a consistent, repeatable time period, thus, upon repeated operation, individual storage photons are released after the same delay period. Further, different doped polycrystalline ceramic optical devices 120 may comprise the same or different delay periods. As a non-limiting example, doped polycrystalline ceramic optical devices 120 comprising the same polycrystalline ceramic and dopant composition may comprise equal delay periods. Thus, a pair of the doped polycrystalline ceramic optical devices 120 having equivalent delay periods may be arranged as a quantum repeater system of an optical system and will each release storage photons simultaneously if they each receive the second pump pulse simultaneously, to facilitate quantum entanglement of storage photons using repeater entanglement optics. Further, the delay period of the individual doped polycrystalline ceramic optical device 120 may be determined by performing a photon echo measurement on the individual the doped polycrystalline ceramic optical device 120.

Referring again to FIG. 1, the doped polycrystalline ceramic optical device 120 may comprise a low phonon energy (e.g., Debye energy), which may limit unintended electron dephasing. For example, the doped polycrystalline ceramic optical device 120 may comprise a phonon energy of between about 100 cm$^{-1}$ and about 800 cm$^{-1}$, for example, 200 cm$^{-1}$, 300 cm$^{-1}$, 400 cm$^{-1}$, 500 cm$^{-1}$, 600 cm$^{-1}$, 700 cm$^{-1}$, or the like. Electron dephasing refers to phonon assisted coupling from a trapped electron orbital to a degenerate or nearly degenerate orbital. Unintended electron dephasing refers to energy state transfer (e.g. phonon assisted coupling) into the first ground state G, by the superposition of the shaped spectral structure of the rare-earth element dopant 130, that causes unintentional release of the storage photon before the desired release of the storage photon. For example, unintended electron dephasing refers to electron (e.g., superposition) dephasing that occurs before receipt of the first pump pulse or the second pump pulse by the doped polycrystalline ceramic optical device 120. Further, lowering unintended electron dephasing may facilitate longer photon storage lifetimes and greater photon storage efficiency.

By lowering the phonon energy of the doped polycrystalline ceramic optical device 120, the photon storage lifetime and the photon storage efficiency of the doped polycrystalline ceramic optical device 120 may be increased. Photon storage lifetime refers to the maximum amount of time a storage photon may remain stored within the doped polycrystalline ceramic optical device 120 before unintended electron (e.g., superposition) dephasing causes the storage photon to be released. Further, photon storage efficiency refers to the percentage of storage photons traversing the doped polycrystalline ceramic optical device 120 that are absorbed and stored. Moreover, the doped polycrystalline ceramic optical device 120 comprises low attenuation, increasing the photon storage efficiency. Attenuation may be lowered by reducing scattering, for example, by optically coupling the first and second pump lasers 180a, 180b to opposite ends of the doped polycrystalline ceramic optical device 120, as depicted in FIG. 1. Further, attenuation may be lowered by reducing the number of voids in the doped polycrystalline ceramic optical device 120. In some embodiments, the doped polycrystalline ceramic optical device 120 is voidless.

Further, uniformly distributing the rare-earth element dopant 130 within the crystal lattice 122 of the doped polycrystalline ceramic optical device 120 may prevent clustering of the rare-earth element dopant 130 at the grain boundaries between individual crystals of the doped polycrystalline ceramic optical device 120. The uniform distribution may reduce spin-spin interactions, thereby reducing unintended electron decay. Moreover, by cooling the doped polycrystalline ceramic optical device 120, for example, using the cooling system 190, the phonon population of the doped polycrystalline ceramic optical device 120 may be reduced, increasing the photon storage lifetime and the photon storage efficiency of the doped polycrystalline ceramic optical device 120.

The doped polycrystalline ceramic optical device 120 may also comprise elements with a nuclear magnetic moment of about $3\mu_N$ or less, for example, about $1\mu_N$ or less. In operation, lower magnetic moments are correlated with longer photon storage lifetime because of smaller magnetic dipole-dipole interaction of the element having a low nuclear magnetic moment to the rare-earth element dopant 130. As a non-limiting example, elements such as Y, Sn, and Pb, which each comprise low magnetic moments, may also be present in the doped polycrystalline ceramic optical device 120. Further, doped polycrystalline ceramic optical devices 120 comprising materials having higher atomic weights may be desired because heavier elements may also comprise lower phonon energy.

The doped polycrystalline ceramic optical device 120 doped with the rare-earth element dopant 130 may also comprise a narrow homogeneous linewidth, which may increase the photon storage lifetime and photon storage efficiencies of the doped polycrystalline ceramic optical device 120 doped with the rare-earth element dopant 130. In particular, a narrower homogeneous linewidth is directly correlated with a longer photon storage lifetime. As used herein, inhomogeneous linewidth refers to the full-width half maximum (FWHM) spectral linewidth of the absorption peak (e.g., wavelength at which maximum absorption occurs) of the rare-earth element dopant 130 of the doped polycrystalline ceramic optical device 120. The inhomogeneous linewidth the doped polycrystalline ceramic optical device 120 doped with the rare-earth element dopant 130 may comprise between about 1 nm and about 25 nm, between about 5 nm and 15 nm, or the like, for example, 2 nm, 5 nm, 10 nm, 15 nm, 20 nm, or the like. Moreover, the homogeneous linewidth of the doped polycrystalline ceramic optical device 120 doped with the rare-earth element dopant 130 may comprise about 7.5 MHz or less, for example, 7 MHz, 6 MHz, 5 MHz 4 MHz, 3 MHz, 2 MHz, 1 MHz, or the like.

As one non-limiting example, the absorption peak of the doped polycrystalline ceramic optical device 120 doped with the rare-earth element dopant 130 comprising erbium may be between about 1510 nm and about 1550 nm, for example, between about 1535 nm and about 1545 nm, such as 1540 nm. As another non-limiting example, the absorption peak of the doped polycrystalline ceramic optical device 120 doped with the rare-earth element dopant 130 comprising thulium may be between about 1600 nm and about 1700 nm, for example, between about 1625 nm and about 1675 nm, such as 1660 nm. Further, in operation, the doped polycrystalline ceramic optical device 120 doped with the rare-earth element dopant 130 is configured to absorb and store a storage photon traversing the doped polycrystalline ceramic optical device 120, as described above, upon receipt of a first pump pulse output by the first pump laser 180a that comprises a wavelength within 15 nm of the wavelength of the absorption peak, for example, within 10 nm, within 5 nm, or equal to the wavelength of the absorption peak. Further, the doped polycrystalline ceramic optical device 120 doped with the rare-earth element dopant 130 may release the storage photon, as described above, upon receipt of a second pump pulse output by the second pump laser 180b that comprises a wavelength within 15 nm of the wavelength of the absorption peak, for example, within 10 nm, within 5 nm, or equal to the wavelength of the absorption peak.

The relationship between photon storage lifetime and homogeneous linewidth may be mathematically described with the following equations:

$$\rho_1 = \frac{1}{c}\frac{3}{2\pi\rho v^5 \hbar^4}|\langle\psi_i^{el}|V_1|\psi_j^{el}\rangle|^2 \text{ and } \rho_2 = \frac{1}{c}\frac{3}{2\pi\rho v^2 \hbar^4}|\langle\psi_i^{el}|V_2|\psi_i^{el}\rangle|^2,$$

where, $V_1$ is the first spatial derivative of the crystal field of the doped polycrystalline ceramic optical device 120, $V_2$ is the second spatial derivative of the crystal field of the doped polycrystalline ceramic optical device 120, $\rho_1$ is the probability amplitude of the transition due to the $V_1$, $\rho_2$ is the probability of the transition due to $V_2$, c is the speed of light, $\rho$ is the density of the host material, for example, the doped polycrystalline ceramic optical device 120, v is the average velocity of a sound wave in the crystal, $\psi_i^{el}$ is the ground state of the electron (e.g., the electron of the rare-earth element dopant 130), and $\psi_j^{el}$ is the excited state of the electron (e.g., the electron of the rare-earth element dopant 130). Further, a phonon coupling coefficient $\beta_{ij}$ may be mathematically described as $\beta_{ij}=\hbar^3 c\omega_{ij}^3\rho_1$, where c is the speed of light, $\omega_u$ is the homogeneous linewidth of the doped polycrystalline ceramic optical device 120, and $\rho_1$ is the is the first order probability amplitude of the transition. As shown above, smaller (e.g., narrower) homogeneous linewidths generate smaller photon coupling coefficients. Further, a small phonon coupling coefficient is correlated with low phonon energy and low phonon energy facilitates longer photon storage lifetimes. Thus, the homogeneous linewidth is inversely proportional to the photon storage lifetime and narrower homogeneous linewidth facilitate longer photon storage lifetimes.

Combining the above equations, the homogeneous lifetime may also be mathematically described as $$w_i^{hom}(cm^{-1}) = \frac{2\hbar c(kT_D)^7}{\pi}\left[\Sigma_{i\neq j}\frac{p_1}{E_i - E_j} + p_2\right]^2\left(\frac{T}{T_D}\right)^7 \int_0^{T_D/T} \frac{x^6 e^x}{(e^x - 1)^2}dx +$$

$$p_1\left\{\sum_{j<i}\Delta E_{ij}^3\left(\frac{e^{\Delta E_{ij}/kT}}{e^{\Delta E_{ij}/kT} - 1}\right) + \sum_{j>i}\Delta E_{ji}^3\left(\frac{1}{e^{\Delta E_{ji}/kT} - 1}\right)\right\}$$

where c is the speed of light, k is the Boltzmann constant, T is the temperature (e.g., the temperature of the doped polycrystalline ceramic optical device 120), $T_D$ is the Debye temperature, $\rho_1$ is the first order probability amplitude of the transition, $\rho_2$ is the second order probability amplitude of the transition, and E is the energy level.

In some embodiments, the rare-earth element dopant 130 may comprise a non-Kramers rare-earth ion, such as $Pr^{3+}$, $Tm^{3+}$, or the like. Doped polycrystalline ceramic optical device 120 doped with non-Kramers rare-earth ions may comprise a narrower homogeneous linewidth than doped polycrystalline ceramic optical devices 120 doped with Kramers rare-earth ions, for example, due to the lack of Kramers degeneracy of non-Kramers rare-earth ions. This may increase the photon storage lifetime of the doped polycrystalline ceramic optical device 120 and reduce unintended electron decay. Moreover, when the rare-earth element dopant 130 comprises thulium, the electrons of the rare-earth element dopant 130 comprising thulium may split into first and second ground states $G_1$ and $G_2$ (FIG. 2) when positioned within a weaker magnetic field than a rare-earth element dopant 130 comprising erbium.

Referring again to FIGS. 1 and 2, a method of storing and releasing a storage photon using the quantum memory system 100 is contemplated. While the method is described below in a particular order, it should be understood that other orders are contemplated. Referring now to FIG. 1, the method may first comprise generating a magnetic field using the magnetic field generation unit 140. As stated above, generating a magnetic field using the magnetic field generation unit 140 causes the ground state of electrons of the rare-earth element dopant 130 doped is split into the first ground state $G_1$ and the second ground state $G_2$, as depicted in FIG. 2.

The method further generating a shaped spectral structure within the rare-earth element dopant 130 of the doped polycrystalline ceramic optical device 120 by irradiating the doped polycrystalline ceramic optical device 120 with a plurality of pump pulses output by the one or more pump lasers 180. Next, the method comprises emitting a storage photon from the storage photon generator 170 optically coupled to the doped polycrystalline ceramic optical device 120 and upon receipt of the storage photon by the doped polycrystalline ceramic optical device 120, the rare-earth element dopant 130 doped within the doped polycrystalline ceramic optical device 120 absorbs the storage photon by transferring a superposition of the shaped spectral structure of the rare-earth element dopant 130 from the first split ground state $G_1$ to the excited energy state $E_1$. For example, the storage photon may comprise a wavelength of between about 300 nm and about 10 µm, for example, 500 nm, 1550 nm, 2200 nm. Next, the method further comprises emitting a first pump pulse from the first pump laser 180a optically coupled to the doped polycrystalline ceramic optical device 120 such that the first pump pulse transfers the superposition of the shaped spectral structure of the rare-earth element dopant 130 from the excited energy state to a second split ground state $G_2$, upon receipt of the first pump pulse by the doped polycrystalline ceramic optical device 120, to store the storage photon within the doped polycrystalline ceramic optical device 120.

Referring still to FIGS. 1 and 2, the method further comprises emitting a second pump pulse from the second pump laser 180b such that the second pump pulse transfers the superposition of the shaped spectral structure of the rare-earth element dopant 130 from the second split ground state $G_2$ to the excited energy state $E_1$, upon receipt of the second pump pulse by the doped polycrystalline ceramic optical device 120. Once back in the excited energy state $E_1$, the superposition of the shaped spectral structure of the rare-earth element dopant 130 will automatically release the storage photon after a delay period, such that the storage photon exits the doped polycrystalline ceramic optical device 120.

Further, in operation, the quantum memory system 100 and more particularly, the doped polycrystalline ceramic optical device 120 doped with a rare-earth element dopant 130 may absorb and store a storage photon for a photon storage lifetime comprising between about 500 ns and about 1 ms, for example, between about 1 µs and about 1 ms or between about 10 µs and about 1 ms. Moreover, in operation, the quantum memory system 100 and, more particularly, the doped polycrystalline ceramic optical device 120 doped with a rare-earth element dopant 130 may absorb and store about 50% or more of a plurality of storage photons traversing the doped polycrystalline ceramic optical device 120, for example, about 70% or more of the plurality of storage photons traversing the doped polycrystalline ceramic optical device 120, about 90% or more of the plurality of storage photons traversing the doped polycrystalline ceramic optical device 120, or the like.

EXAMPLES

Preparation of La, Er Co-Doped $Y_2O_3$ Nanoparticles

A method of manufacturing the doped polycrystalline ceramic optical device 120 of FIG. 1 is contemplated. While the method is described below in a particular order, it should be understood that other orders are contemplated. The method first comprises mixing a plurality of transition metal complexes, a plurality of rare-earth metal complexes, an organic precursor, and water, such as, deionized water, to form a precursor mixture.

The plurality of transition metal complexes may comprise metal complexes, such as metal salts, which include a transition metal, for example, zirconium, yttrium, hafnium, or combinations thereof. Further, the transition metals of plurality of transition metal complexes may include dielectric materials. In some examples, the plurality of transition metal complexes may comprise $YCl_3 \cdot 6H_2O$.

The plurality of rare-earth metal complexes may comprise metal complexes, such as metal salts, that include any of the rare-earth elements described above. In some examples, the rare-earth metal complexes may comprise $ErCl_3 \cdot 6H_2O$, $LaCl_3 \cdot 6H_2O$, or combinations thereof. As stated above, by using rare-earth metal complexes to form the plurality of rare-earth doped nanoparticles the rare-earth element dopant positioned within resultant doped polycrystalline ceramic optical device may be more uniformly distributed within the crystal lattice of the doped polycrystalline ceramic optical device, improving performance of the doped polycrystalline ceramic optical device. The organic precursor may comprise urea, ammonium hydroxide, or the like.

In some examples, the precursor mixture may include between about 40 g and about 80 g of the transition metal complexes, for example, about 50 g, 60 g, 65 g, 65.53 g, 70 g, or the like. The precursor mixture may also include between about 0.01 g and about 0.5 g of the rare-earth metal complexes, for example, about 0.05 g, 0.1 g, 0.15 g, 0.2 g, 0.25 g, 0.35 g, or the like. Further, the precursor mixture may include between about 350 g and about 450 g of the organic precursor, for example, about 375 g, 388.8 g, 400 g, 425 g, or the like. Moreover, the precursor mixture may include between about 2 L and about 6 L of deionized water, for example, about 3 L, 4 L, 4.32 L, 5 L, or the like.

The method further comprises heating the plurality of transition metal complexes, the plurality of rare-earth metal complexes, the organic precursor, and the deionized water (e.g., the precursor mixture) to a heating temperature for a heating period to induce thermal decomposition of the organic precursor and generate a chemical reaction between the transition metal complexes, the rare-earth metal complexes, and the organic precursor to produce a plurality of rare-earth doped nanoparticles. For example, the heating temperature may be between about 70° C. and about 100° C., such as about 80° C., 90° C., 95° C., or the like, and the heating period may be between about 0.5 hours and about 3 hours, such as, 1 hour, 2 hours, or the like.

In some examples, $La^{3+}$, $Er^{3+}$ co-doped $Y_2O_3$ nanoparticles are synthesized by the reaction of urea, $LaCl_3$, $ErCl_3$, and $YCl_3$ in boiled water. In a typical synthesis, a urea solution (6.7 mol urea in 0.35 L water at 100° C.) is poured into a metal salts solution (a mixture of $LaCl_3$, $ErCl_3$, and $YCl_3$, 0.22 mol in 4 L water at 100° C.). The reaction is kept at 100° C. for 1 hour. The thermal decomposition of urea provides $OH^-$ and $CO_3^{2-}$ which react with the transition metal of the transition metal complexes and the rare-earth metals of the rare-earth metal complexes to produce rare-earth doped nanoparticles, for example, $Y_{1-x-y}La_xEr_y(OH)CO_3 \cdot H_2O$ amorphous nanoparticles.

Further, the $Y_{1-x-y}La_xEr_y(OH)CO_3 \cdot H_2O$ amorphous nanoparticles may be filtered and collected and then annealed at an annealing temperature of between about 500° C. and about 900° C., such as about 600° C., 700° C., 800° C., or the like (e.g., 750° C.) to convert the amorphous nanoparticles into crystalline $(Y_{1-x-y}La_xEr_y)_2O_3$ nanoparticles. The chemical yield of the rare-earth doped nanoparticles 110 may be between about 85% and about 98%, for example 88%, 90%, 92%, 95%, or the like. The $Er^{3+}$ and $La^{3+}$ doping concentration can be tuned by varying Er/Y and La/Y ratios in the starting materials.

Figures 3A, 3B:
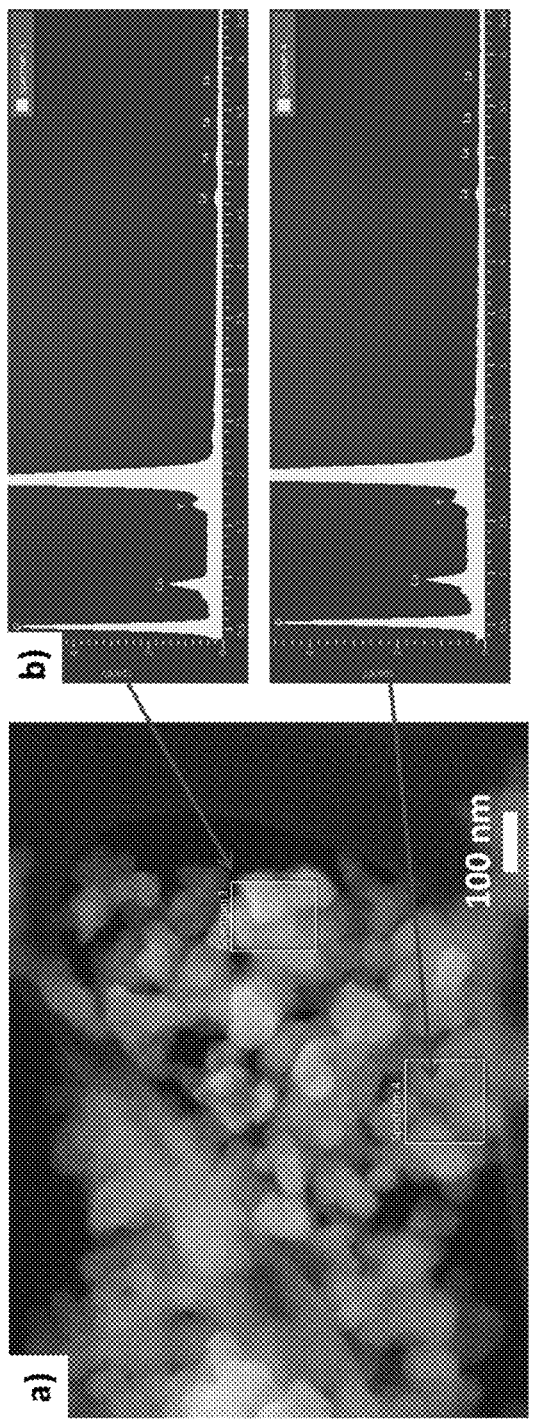
FIG. 3A illustrates a scanning electron microscope (SEM) image of $Er^{3+}$, $La^{3+}$ co-doped $Y_2O_3$ nanoparticles, according to some embodiments.
FIG. 3B illustrates an energy dispersive x-ray (EDS) spectroscopy analysis to confirm the presence of La in $Y_2O_3$ nanoparticles, according to some embodiments.

FIG. 3A illustrates a scanning electron microscope (SEM) image of $Er^{3+}$, $La^{3+}$ co-doped $Y_2O_3$ nanoparticles. Doping concentration of $Er^{3+}$ and $La^{3+}$ are about 20 ppm and 2%, respectively. The nanoparticles are agglomerated and the average particle size is about 40 nm. Particle sizes do not reflect clear change when $Le^{3+}$ doping concentration is varied in a range of 0% to 10%. FIG. 3B illustrates an energy dispersive x-ray (EDS) spectroscopy analysis to confirm the presence of $La^{3+}$ in $Y_2O_3$ nanoparticles. The Cu peak is from SEM of the sample substrate.

Figures 4A, 4B:
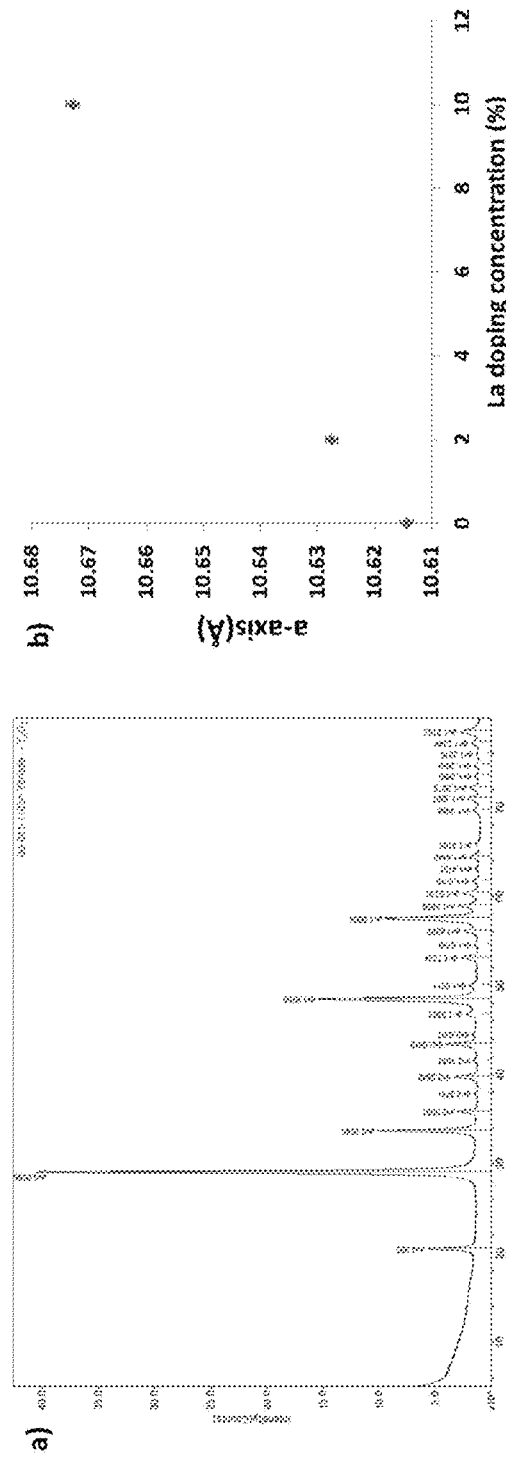
FIG. 4A illustrates a powder x-ray diffraction (XRD) pattern of 2% $La^{3+}$ doped $Y_2O_3$ nanoparticles, according to some embodiments.
FIG. 4B illustrates unit cell parameters of $Y_2O_3$ nanoparticles doped with varying concentrations of $La^{3+}$, according to some embodiments.

FIG. 4A illustrates a powder x-ray diffraction (XRD) pattern of 2% $La^{3+}$ doped $Y_2O_3$ nanoparticles to reveal a pure cubic $Y_2O_3$ phase. The pattern of FIG. 4A matches well with a cubic $Y_2O_3$ phase, but with XRD peaks slightly shifted. This indicates that $La^{3+}$ dopants are incorporated into the $Y_2O_3$ lattice and expand the unit cell ($La^{3+}$ is larger than $Y^{3+}$). The unit cell parameter (a-axis) was calculated by Rietveld refinement of XRD patterns. FIG. 4B illustrates unit cell parameters of $Y_2O_3$ nanoparticles doped with varying concentrations of $La^{3+}$. The incorporation of $La^{3+}$ into $Y_2O_3$ lattice expands cell parameters from 10.6143±0.001 Å ($Y_2O_3$ nanoparticles), to 10.6275±0.001 Å (2% $La^{3+}$ doped $Y_2O_3$ nanoparticles) and 10.6728±0.001 Å (10% $La^{3+}$ doped $Y_2O_3$ nanoparticles).

Further, the amount of rare-earth element dopant in the plurality of rare-earth doped nanoparticles may be altered by changing the ratio of transition metal complexes and rare-earth metal complexes in the precursor mixture. In some examples, when the ratio of the transition metal complexes and the rare-earth metal complexes is about 137 parts of the plurality of transition metal complexes to about 1 part of the plurality of rare-earth metal complexes, the resulting rare-earth doped nanoparticles may comprise about 0.97% rare-earth element dopant. In some examples, when the ratio of the plurality of transition metal complexes and the plurality of rare-earth metal complexes is about 548 parts of the plurality of transition metal complexes to about 1 part of the plurality of rare-earth metal complexes, the resulting rare-earth doped nanoparticles may comprise about 0.25% rare-earth element dopant.

Other rare-earth element dopants are also contemplated. In some examples, $Lu^{3+}$, $Gd^{3+}$, and $Sc^{3+}$, each of which do not have energy interactions with $Er^{3+}$, may also be used as co-dopants to modify optical refractive index of $Y_2O_3$. Both $Lu^{3+}$ and $Sc^{3+}$ co-dopants may also be used to increase refractive index of $Y_2O_3$. These other rare-earth co-dopants are advantageous because (1) some elements (e.g., $Gd^{3+}$ and $Sc^{3+}$) have a higher solubility than $La^{3+}$ in $Y_2O_3$, which thereby allows for tuning refractive index across a broader range; and (2) $Lu^{3+}$ has a similar radius as $Y^{3+}$. Co-doping with $Lu^{3+}$ can reduce structural disorder and reduce the inhomogeneous linewidth.

Preparation of $La^{3+}$, $Er^{3+}$ Co-Doped $Y_2O_3$ Transparent Ceramics

After preparation of the nanoparticles, these $La^{3+}$, $Er^{3+}$ co-doped $Y_2O_3$ nanoparticles may be pressed into a pellet before undergoing sintering. In operation, the $La^{3+}$, $Er^{3+}$ co-doped $Y_2O_3$ nanoparticles may be pressed (e.g., uniaxially pressed, isostatically pressed, etc., or combinations thereof) into a pellet having the rare-earth doped nanoparticles. The pellet having the rare-earth doped nanoparticles may be uniaxially pressed in a steel die at about 8 k-lb force and/or isostatically pressed at about 25 k-psi using an iso-pressing sheath (e.g., latex isopressing sheaths) at room temperature.

After pressing, the pellets may be sintered. During the sintering process, the pellets may be heated from room temperature to a maximum temperature over a period of about 12 hours and may be maintained at the maximum temperature for about 2 hours. Further, the maximum temperature of between about 1300° C. and 1800° C., for example, about 1400° C., 1450° C., 1500° C., 1515° C. 1550° C., 1600° C., 1615° C., 1650° C., 1700° C., or the like. Next, the pellet may be cooled back to room temperature for a cooling period of about 12 hours. Further, it should be understood that sintering the pellet having the rare-earth doped nanoparticles forms the doped polycrystalline ceramic optical device having a rare-earth element dopant, described above.

After sintering, the pellet may also be hot isostatically pressed (HIP) at a temperature of between about 1400° C. and about 1800° C., for example, about 1515° C., 1590° C., 1625° C., 1650° C., or the like. Further, the pellet having the rare-earth doped nanoparticles may be placed under high pressure while heated, for example, for about 16 hours at about 29 k-psi. Moreover, during the HIP process, the pellet having the rare-earth doped nanoparticles may be placed in argon or another noble gas. In some examples, the maximum temperature reached during the sintering process may be greater than the maximum temperature reached during the HIP process.

Figure 5:
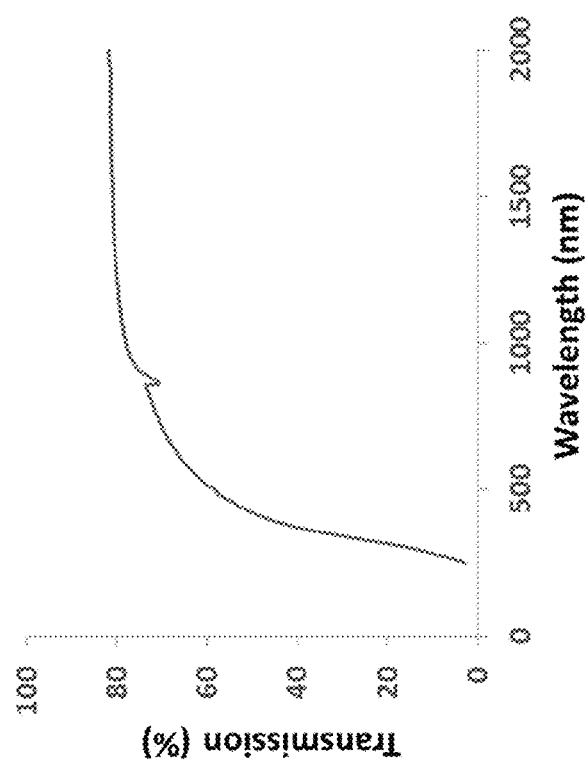
FIG. 5 is a plot of axial optical transmission at various light wavelengths through a thickness (1.61 mm) of a 1% $La^{3+}$ doped $Y_2O_3$ ceramic sample, according to some embodiments.

FIG. 5 is a plot of axial optical transmission at various light wavelengths through a thickness (1.61 mm) of a 1% $La^{3+}$ doped $Y_2O_3$ ceramic sample. A dip at about 850 nm is due to detector switch. For a sample having about 50 nm surface roughness, the axial optical transmission is about 80% in the wavelength range of 1250 nm to 2000 nm. This is close to theoretical limits of $Y_2O_3$ at a wavelength of 1535 nm (82.7%) when only considering surface reflections.

Figures 6A, 6B, 6C:
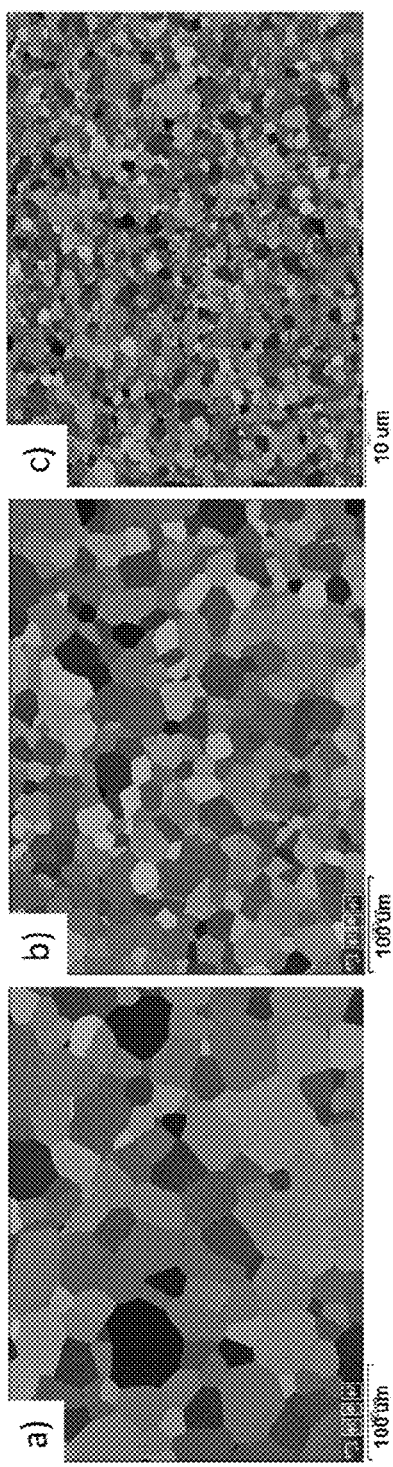
FIG. 6A-6C illustrate electron backscatter diffraction (EBSD) images of grains in $Y_2O_3$ transparent ceramics doped with different concentrations of $La^{3+}$, according to some embodiments.

FIG. 6A-6C illustrate electron backscatter diffraction (EBSD) images of grains in $Y_2O_3$ transparent ceramics doped with different concentrations of $La^{3+}$. The average grain area is calculated using at least 1500 grains. The scale bar is 100 μm in FIGS. 6A and 6B and 10 μm in FIG. 6C. Each of the ceramic samples of FIGS. 6A-6C were prepared by the same thermal process with different $Le^{3+}$ doping concentrations. It is seen that $Le^{3+}$ doping significantly reduces grain size of $Y_2O_3$ ceramics. For example, in FIG. 6A, the average grain area of $Y_2O_3$ is about 1072 μm$^2$; in FIG. 6B, the average grain area of 1% $La^{3+}$-doped $Y_2O_3$ is about 398 μm$^2$; and in FIG. 6C, the average grain area of 4% $La^{3+}$-doped $Y_2O_3$ is about 1 μm$^2$.

Figure 7:
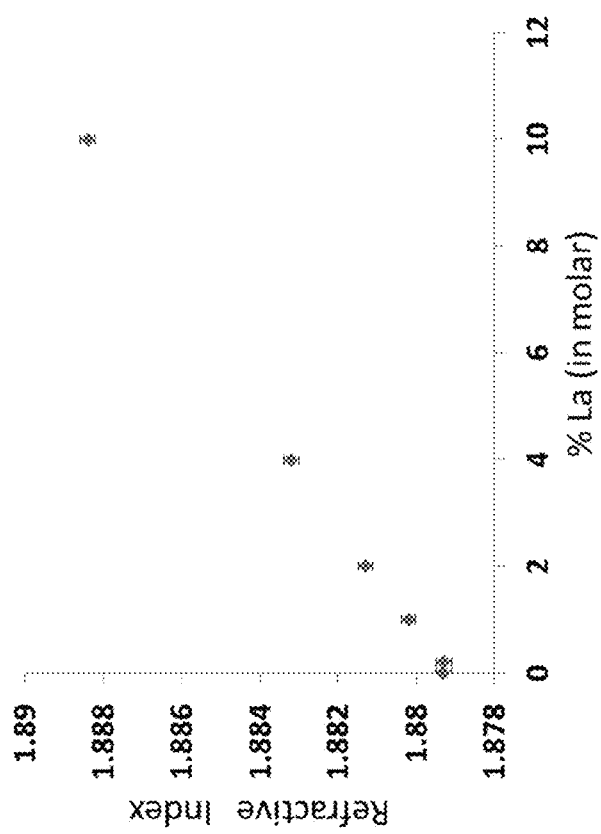
FIG. 7 is a plot of optical refractive index of $Y_2O_3$ transparent ceramics doped with varying concentrations of $La^{3+}$, according to some embodiments.
Figure 8A:
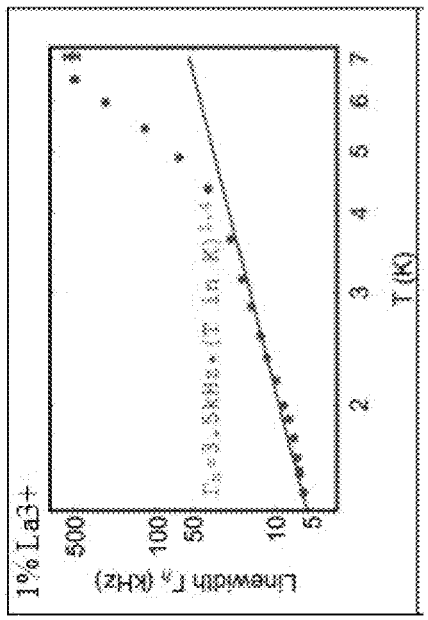
FIGS. 8A-8D illustrate the homogeneous linewidth of $Er^{3+}$ $^4I_{13/2}$-$^4I_{15/2}$ transition in $Y_2O_3$ transparent ceramics doped with varying concentrations of $La^{3+}$, according to some embodiments.
Figure 8B:
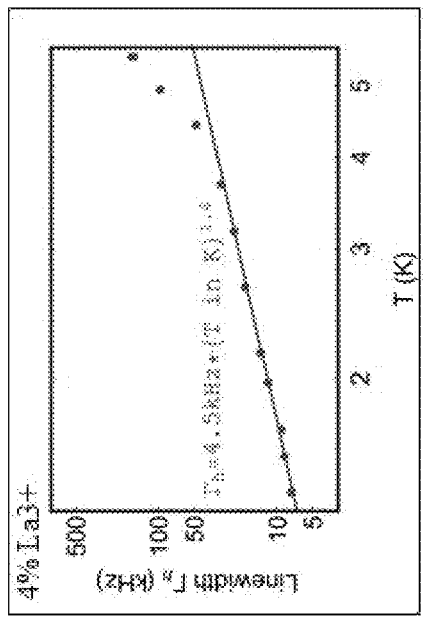
Figure 8C:
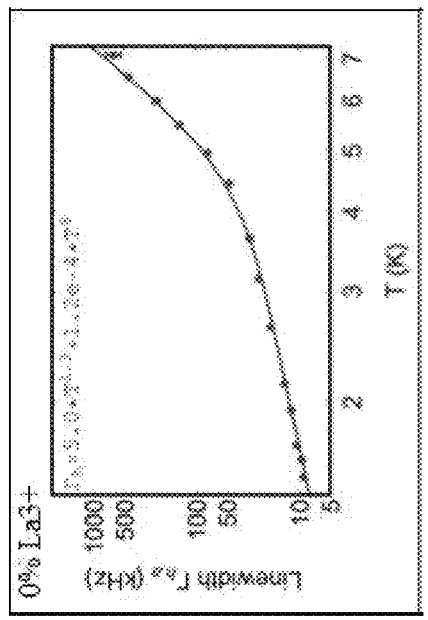
Figure 8D:
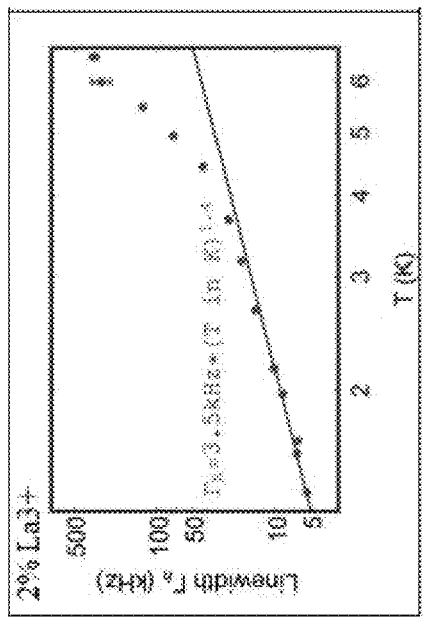

FIG. 7 is a plot of optical refractive index of $Y_2O_3$ transparent ceramics doped with varying concentrations of $La^{3+}$. $La^{3+}$ doping increases the optical refractive index of transparent $Y_2O_3$ ceramics by at least about $\Delta n=+0.001$/molar % $La^{3+}$, as shown in FIG. 7. At the higher end of $La^{3+}$ doping (about 10%), the optical refractive index is increased by about $\Delta n=+0.001$/molar % $La^{3+}$ (i.e., $\Delta n/n=0.48\%$). This index difference is sufficient for fabricating waveguides having a $La^{3+}$, $Er^{3+}$ co-doped $Y_2O_3$ core and $Y_2O_3$ cladding.

After the HIP process, the pellet may be polished, for example, to a 0.5 μm diamond finish. Sintering the pellet having the rare-earth doped nanoparticles forms the doped polycrystalline ceramic optical device 120 having a rare-earth element dopant 130, described above.

Optical Dephasing Properties of $Er^{3+}$, $La^{3+}$ Co-Doped $Y_2O_3$ Transparent Ceramics The homogeneous linewidth of $Er^{3+}$ $^4I_{13/2}$–$^4I_{15/2}$ transition in $Er^{3+}$, $La^{3+}$ co-doped $Y_2O_3$ transparent ceramics was measured using two-pulse photon echo spectroscopy to determine if $La^{3+}$ co-doping deteriorates the optical dephasing properties of $Er^{3+}$ $^4I_{13/2}$–$^4I_{15/2}$ transition. FIGS. 8A-8D illustrate the homogeneous linewidth of $Er^{3+}$ $^4I_{13/2}$–$^4I_{15/2}$ transition in $Y_2O_3$ transparent ceramics doped with varying concentrations of $La^{3+}$ ranging from 0% $La^{3+}$ to 4% $La^{3+}$. The $Er^{3+}$ concentration is 20 ppm in all samples. Doping $La^{3+}$ into $Y_2O_3$ is shown to not increase the homogeneous linewidth of $Er^{3+}$ (i.e., there is no noticeable difference in linewidth). In fact, the 1% and 2% $La^{3+}$ doping (FIGS. 8B and 8C, respectively) actually decreases homogeneous linewidth. This indicates that $La^{3+}$ co-doped $Y_2O_3$ may be used to fabricate waveguides without detrimentally affecting the optical dephasing properties of $Er^{3+}$.

In some examples, Dieke diagram calculations have shown that in addition to $La^{3+}$, $Gd^{3+}$ has no transitions (i.e., homogeneous linewidth of $Er^{3+}$ $^4I_{13/2}$–$^4I_{15/2}$ transitions) until deep UV, while $Lu^{3+}$ has full 4f orbits and therefore also no transitions. The Dieke diagram illustrates energy-level diagrams for trivalent rare-earth metal ions. Thus, both $Gd^{3+}$ and $Lu^{3+}$ may also be used as co-dopants with $Er^{3+}$ to fabricate waveguides without detrimentally affecting the optical dephasing properties of $Er^{3+}$.

Figure 9:
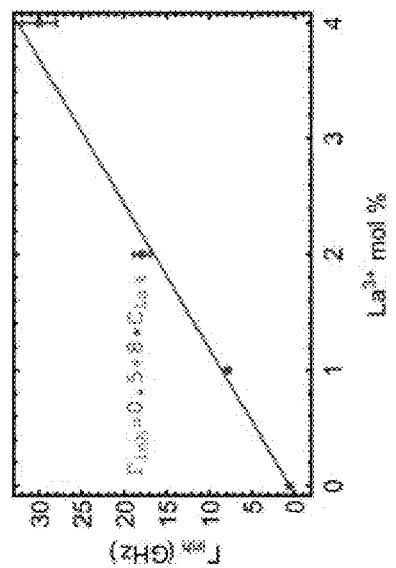
FIG. 9 is a plot of inhomogeneous linewidth of $Er^{3++4}I_{13/2}$-$^4I_{15/2}$ transition in $Y_2O_3$ transparent ceramics doped with varying concentrations of $La^{3+}$, according to some embodiments.

FIG. 9 is a plot of inhomogeneous linewidth of $Er^{3+}$ $^4I_{13/2}$–$^4I_{15/2}$ transition in $Y_2O_3$ transparent ceramics doped with varying concentrations of $La^{3+}$ ranging from 0% $La^{3+}$ to 4% $La^{3+}$. The $Er^{3+}$ concentration is 20 ppm in all samples. The inhomogeneous linewidth of $Er^{3+}$ $^4I_{13/2}$–$^4I_{15/2}$ transition is linearly dependent on the $La^{3+}$ doping concentration, up to at least 4% $La^{3+}$ doping. This indicates a static structural disorder introduced by doping $La^{3+}$ into $Y_2O_3$. Static structural disorder means that different amounts of $Er^{3+}$ within the $Y_2O_3$ structure creates slightly different local environments in the $Y_2O_3$ lattice. In some examples, one $Er^{3+}$ component may be separated from a $La^{3+}$ component by about 5 nm, while another $Er^{3+}$ component may be separated from the same or different $La^{3+}$ component by about 10 nm. These differences may cause small shift in $Er^{3+}$ energy transitions. However, once the sample has crystalized, the relative ion positions (and therefore the configuration) is fixed, or in other words, static.

Rare-Earth Doped $Y_2O_3$ Ceramic Rib Waveguides

In some examples, $Y_2O_3$ nanoparticles may be dispersed in slurries by milling nanoparticles with mixture solvents. For example, milling of the rare-earth doped nanoparticles may be conducted using a milling media, for example, a yttria stabilized grinding media. The milling media may comprise a diameter between about 1 mm and 3 mm, for example, 1.5 mm, 2 mm, 2.5 mm, or the like. Further, additional materials may be added before or during the milling process, for example, a mixture of ethanol solvents, 1-butanol, propylene glycol, organophosphate, such as Phosphalon™ PS-236, and deionized water. In operation, the rare-earth doped nanoparticles may be milled for between about 75 hours and about 100 hours, for example, about 80 hours, 85 hours, 90 hours, 95 hours, or the like. Moreover, the rare-earth doped nanoparticles may be milled using a VIBRA-MILL® milling system.

In some examples, about 25 g of the rare-earth doped nanoparticles may be milled using between about 100 g and about 150 g of milling media, for example, 110 g, 120 g, 130 g, 140 g, or the like. Further, the additional materials added before or during the milling process may include about 15 g and about 20 g of ethanol solvents, for example, about 16 g, 17 g, 18 g, 18.3 g, 19 g, or the like, between about 2 g and about 6 g of 1-butanol, for example, about 3 g, 4 g, 4.4 g, 5 g, or the like, between about 0.5 g and about 1.5 g of propylene glycol, such as about 1.0 g, between about 0.25 g and about 0.5 g of an organophosphate, such as Phosphalon™ PS-236, for example, about 0.3 g. 0.35 g, 0.38 g, 0.4 g, 0.45 g, or the like, and between about 0.5 g and about 2.5 g of deionized water, for example, about 1 g, 1.3 g, 1.5 g, 2 g, or the like.

In operation, milling disperses the rare-earth doped nanoparticles into a slurry, which may be separated from the milling media during a filtration process, for example, using a screen. Next, at least one binder (e.g., polyvinyl butyral) and at least one plasticizer (e.g., dibutyl phthalate) may be added to the slurry having the rare-earth doped nanoparticles, which may then be mixed, for example, using a Mazerustar™ planetary mixer (such as model KK-400W). Next, the slurry having the plurality of rare-earth doped nanoparticles may be rolled, for example, using rollers operating at about 25 RPM for about 18-24 hours to remove air within the slurry having the rare-earth doped nanoparticles. By removing air, the resulting doped polycrystalline ceramic optical device (e.g., formed using the sintering process described below) may be voidless. In operation, a longer milling process, for example, a milling process of about 90 hours or longer, may be desired to reduce the voids and increase the transparency of the resultant doped polycrystalline ceramic optical device.

In some examples, the slurry having the rare-earth doped nanoparticles may be cast into a film (i.e., green tapes) using a casting process such as a tape casting process, for example, using a TAM Ceramics® hydraulically driven tape caster.

Figure 10:
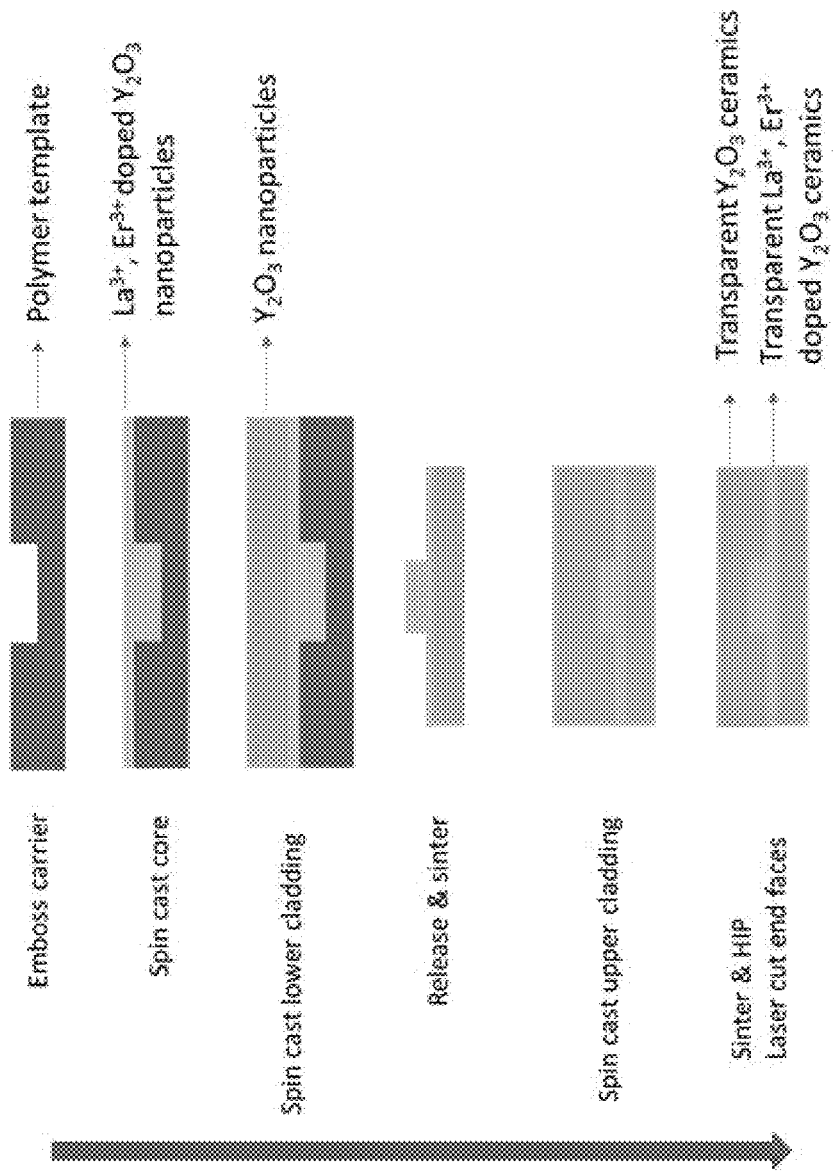
FIG. 10 illustrates a process flow of a ceramic rib waveguide fabrication, according to some embodiments.
Figure 11:
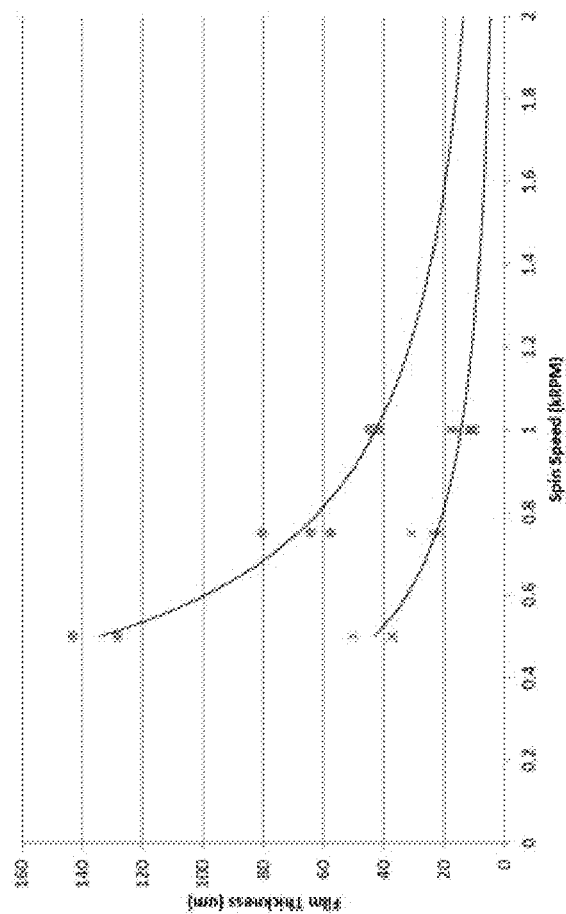
FIG. 11 illustrates a plot of $Y_2O_3$ film thickness as a function of spin speed onto Teflon carrier release liner, according to some embodiments.

In some examples, the nanoparticle slurry may be cast into a film using spin casting or other solution coating or printing process. For example, spin casting $Y_2O_3$ nanoparticle slurries on polymer template substrates may be used to prepare ceramic rib waveguides in which a core is transparent $La^{3+}$, $Er^{3+}$ co-doped $Y_2O_3$ and a cladding is transparent $Y_2O_3$, as shown in FIG. 10. In one example, FIG. 11 illustrates a plot of $Y_2O_3$ film thickness as a function of spin speed onto Teflon carrier release liner. In other words, FIG. 11 shows a spin curve for spun cast green tape films before sintering. Thinner films represent single coatings while thicker films represent double coatings, with the second coating applied at the same conditions as the first coating. Thus, casting multiple films is contemplated. In some examples, the nanoparticle slurry may be cast into a film or patterned structure using tape casting or other solution coating or printing processes such as screen printing, gravure printing, micro-gravure coating, flexo printing, stamping, embossing, micro-replication, and slot die coating as examples.

FIGS. 12A and 12B illustrate a sintered single layer of $Y_2O_3$ with a thickness of about 12.1 μm and a sintered double layer of $Y_2O_3$ with a thickness of about 29.0 μm, respectively. In each of FIGS. 12A and 12B, the layer(s) is spin coated onto a Teflon carrier film, released, and sintered (see FIG. 10). The film thickness after sintering is about 70% of the film thicknesses in the green (unsintered) state.

After casting, the film having the rare-earth doped nanoparticles may be dried, for example, by covering the film with a covering material such that an air gap is located between the film and the covering material for a drying period, for example, between about 18 hours and about 24 hours, e.g., 20 hours, 22 hours, or the like. Next, the film having the rare-earth doped nanoparticles may be dried in a drying oven, hot plate, or the like at about 50° C. for about 20-25 mins or at about 100° C. for about 5-10 mins, which may remove organics (e.g., solvent) present in the film having the rare-earth doped nanoparticles. Further, the film having the rare-earth doped nanoparticles may have a thickness of about 100 μm or less, for example, about 75 μm, 50 μm, 25 μm, 20 μm, 15 μm, 10 μm, or the like.

Thereafter, the green tape may be sintered into micrometer-thick transparent $Y_2O_3$ ceramics. In other words, sintering the film having the rare-earth doped nanoparticles forms the doped polycrystalline ceramic optical device having a rare-earth element dopant, described above. Before sintering, the film having the rare-earth doped nanoparticles may be placed on a setter, such as an alumina setter. Once placed on the setter, the film having the rare-earth doped nanoparticles may be sintered using a sintering furnace, such as a CM™ Furnace.

In some examples, during the sintering process, the film having the rare-earth doped nanoparticles may be sintered using the following sintering schedule. First, the film having the rare-earth doped nanoparticles may be heated from room temperature to 200° C. for a heating period of about 1 hour then the film may be heated from about 200° C. to about 500° C. for a heating period of about 2 hours then heated from 500° C. to about 1550° C. for a heating period of about 5 hours. Next, the film having the rare-earth doped nanoparticles may be maintained at a temperature of about 1550° C., for example, a temperature at least about 1500° C. or greater, for a dwelling period of about 2 hours, then cooled from 1550° C. to about room temperature over a cooling period of about 3 hours. In operation, a higher maximum temperature during the sintering process, for example, a maximum temperature of about 1550° C. or more may be desired to reduce the voids and increase the transparency of the resultant doped polycrystalline ceramic optical device.

Solution Processing Fabrication of Rare-Earth Doped $Y_2O_3$ Ceramic Rib Waveguides Rare-earth doped $Y_2O_3$ nanoparticles can also be used to prepare ceramic waveguides through solution processes. Conventional solution processing of optical waveguides use "low temperature" materials that do not include nanoparticle dopants that increase optical scattering during waveguide propagation. However, because "solution" processing of waveguides in the present disclosure uses slurries, the materials, structure, and processes used to make the waveguides differ significantly. These solution processing methods can be used to form polycrystalline ceramic optical devices (doped and non-doped) in general.

Materials

The slurries, as described above, comprise solvents (i.e., vehicles), binders (i.e., hosts), and nanoparticles in the size range of 1 nm to 1 μm. In contrast with previous solution processing, the solvent, binder, and other non-inorganic components of the slurry are removed from the final component during a sintering process. This removal process is significantly different from polymer, sol-gel and similar waveguides where the host material (i.e., binder) remains in the final waveguide and has an impact on device performance. Techniques described here may be used with other nanoparticle glass, glass-ceramic, or ceramic slurries where the binder/host is removed and inorganic particles sinter to reduce optical scattering and loss.

Waveguide Processing

The slurries can be processed using a variety of solution methods used to make continuous films or patterns, including: spin casting, slot die coating, tape casting, micro-gravure coating, dip coating, and blade coating. Additionally, a variety of printing techniques are also possible to pattern layers including: screen printing, flexo printing, gravure printing, stamping, embossing, micro-replication, and offset-gravure printing. These processing techniques may be used for any of the components in the multi-layer waveguide stack and are scalable for use in production of optical waveguides made from nanoparticles.

Slurries can be cast onto either flexible or rigid, permanent or temporary substrates. For example, the slurries may be coated onto flexible polymer release liners meant to be used only for casting purposes. After the film is formed, it is then separated from the polymer substrate for sintering. In some examples, the slurry may be cast onto rigid substrates where it remains attached during the sintering process. For example, a $Y_2O_3$ slurry can be disposed onto a $Y_2O_3$ substrate of thickness in a range of 100 μm to 1 cm.

After coating, the film may be heated to remove a substantial portion of the volatile solvent. Additional layers may be coated onto the dried film. In some examples, multiple wet layers may be disposed upon one another, with the stack heated to remove volatile components. The dried film of the one or more layers can also be separated at this point from a temporary polymer release liner before sintering. The dried film of a single or multiple layer stack can have a thickness in a range of 1 µm to 100 µm.

After solution coating, the films can be sintered. If released from a polymer liner, the films can be sintered as a free-standing part in the form of a discrete piece or part of a continuous web. The released film may also be placed temporarily onto a setter board during the sintering process. Alternatively, the released film may then be laminated to a new substrate of similar material where it will remain attached. The new substrate may have previously deposited layers or patterned features as needed. In some examples, a $Y_2O_3$ cast film can be laminated to a sintered $Y_2O_3$ substrate. This would enable the $Y_2O_3$ film to be cast in a continuous tape casting process and then sintered as a discrete component. During the sintering process, any remaining solvent, binder, or other volatile material is removed and leaves behind the bonded inorganic nanoparticles, thereby resulting in dimensional changes.

After sintering, additional coatings may be applied on one or both surfaces to the sintered film and undergo additional sintering as needed. The sintered film with one of multiple coatings also undergoes HIP processing to minimize optical scattering on the material. During HIP, additional dimensional change may also occur. This dimensional change includes changes to the vertical film thickness, any lateral features, film surface roughness, and width of waveguide structures. For example, the thickness, lateral feature dimension, and surface roughness in the final sintered and processes component may be smaller than the values before final processing.

The vertical optical confinement is achieved by the index difference between the layers. This vertical stack can be a 3-layer (clad-core-clad) structure or additional layers for more complex waveguide designs. Layers present during sintering or HIP steps require compatibility with the temperatures associated with each step. Layers applied after sintering or HIP can be lower temperature materials (e.g., polymers). Vertical layers may be selected for specific application performance or processing requirements based on mechanical, optical, thermal (including thermal expansion), and electrical requirements. The additional layers can be formed by solution, lamination, or vacuum processing methods.

Lateral optical confinement is achieved by patterning features into at least one of the optical layers. This results in a channel or rib/trench waveguide structure, depending on the design. Direct patterning of sintered layers may be very inefficient depending on the material and may result in increased scattering from sidewall/surface roughness. In some examples, direct patterning of layers made from $SiO_2$ nanoparticles may efficiently be wet or plasma etched. In contrast, patterning of sintered $Y_2O_3$ layers is very difficult comparatively.

Any required patterning of the inorganic materials can take advantage of solution processing techniques of the slurry (see FIG. 10).

A nanoparticle slurry can be cast onto a substrate or carrier layer that has previously been patterned. After drying, the slurry is shaped by a mold upon which it was coated. Patterning the nanoparticle film during slurry "solution" processing minimizes surface roughness and scattering sites that might be created during post-sintering methods such as laser ablation, ion milling, or etching. A polymer carrier film used can be pre-patterned by etching, embossing, or coating/printing additive approaches. After the nanoparticle slurry is dried, it can be released from the pre-patterned carrier film and to form a complementary surface feature. Alternatively, the nanoparticle slurry may be cast onto a patterned permanent substrate. Alternative methods of patterning include printing, stamping, embossing, and replication methods as mentioned previously.

Features for optical coupling can also be created. In some examples, the end face may be cut with a dicing saw or laser ablated to enable optical fiber butt coupling. The waveguide end faces can be polished as needed. Alternatively, optical waveguide elements can be created to enable other coupling methods (e.g., by evanescent field or optical gratings).

Waveguide Design and Functionality

The optical waveguide can be designed to achieve required optical or electro-optical performance, including: optical mode shape, mode confinement, waveguide device functionality, and polarization dependence. Optical devices can be fabricated with path lengths of at least 10 mm, or at least 50 mm, or at least 100 mm, or at least 500 mm. Optical waveguides can be fabricated having straight sections, curved sections, gratings, vertically tapered, or stacked structures.

Figure 13:
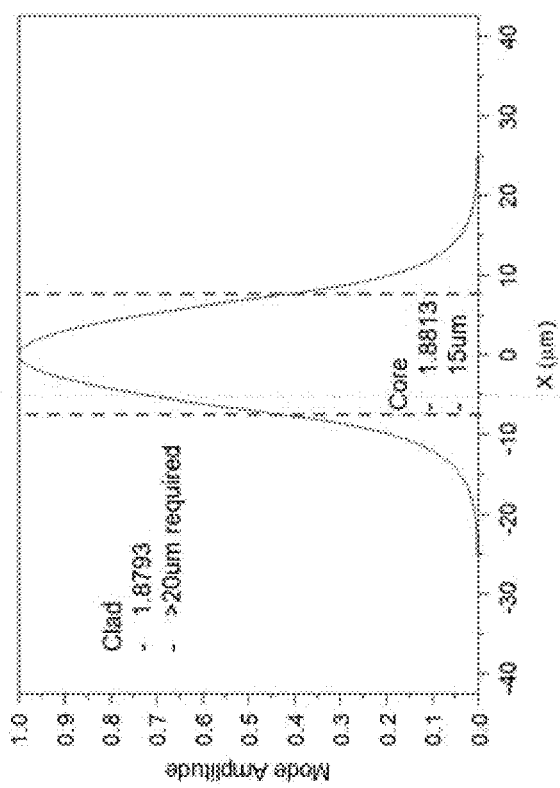
FIG. 13 illustrates an optical mode shape for slab waveguides, according to some embodiments.

Beam propagation simulations were conducted to test the functionality of the $Y_2O_3$ optical waveguide. The beam wavelength is 1.55 µm, the refractive index of a core portion of the waveguide is 1.8813, and the refractive index of a cladding portion of the waveguide is 1.8793. FIG. 13 illustrates an optical mode shape for slab waveguides. A 15 µm thick core layer has an optical mode tail extend about 25 µm into the cladding layer. The mode effective index was 1.8809.

Thus, as presented herein, improved methods for tuning optical refractive index of $Er^{3+}$ doped metal oxide transparent ceramics as disclosed without decreasing the optical coherence lifetime of $Er^{3+}$ $^4I_{13/2}$-$^4I_{15/2}$ transitions.

At least one rare-earth metal dopant (e.g., lanthanum ($La^{3+}$), cerium ($Ce^{3+}$), praseodymium ($Pr^{3+}$), neodymium ($Nd^{3+}$), promethium ($Pm^{3+}$), samarium ($Sm^{3+}$), europium ($Eu^{3+}$), gadolinium ($Gd^{3+}$), terbium ($Tb^{3+}$), dysprosium ($Dy^{3+}$), holmium ($Ho^{3+}$), thulium ($Tm^{3+}$), ytterbium ($Yb^{3+}$), lutetium ($Lu^{3+}$), scandium ($Sc^{3+}$)) or oxides thereof or at least one non-rare earth metal dopant (e.g., zirconium ($Zr^{3+}$, $Zr^{4+}$)) or oxides thereof may be used as index modifiers to increase the refractive index of metal oxide ceramics.

The core layer may include a $Er^{3+}$ erbium dopant and a $La^{3+}$ lanthanum dopant, or a $Lu^{3+}$ lutetium dopant, or a $Gd^{3+}$ gadolinium dopant, or a $Sc^{3+}$ scandium dopant. The at least one cladding layer has a refractive index that is lower than a refractive index of the core layer.

Photons traversing the core layer are configured to undergo total internal reflection at a boundary between the core layer and the at least one cladding layer. The core layer has an average grain size in a range of 1 µm² to 500 µm². The core layer has a refractive index ($n_1$) greater than a refractive index of $Y_2O_3$ ($n_2$) such that $n_1$-$n_2$ is in a range of 0.001/molar % to 0.009/molar %.

In some examples, a quantum memory includes: at least one doped polycrystalline ceramic optical device with a ceramic waveguide having: a doped yttrium oxide ($Y_2O_3$) ceramic core layer; and at least one cladding layer comprising $Y_2O_3$ surrounding the core layer, such that the core layer includes an erbium dopant and at least one rare earth metal dopant, comprising: lanthanum, cerium, praseodymium, neodymium, promethium, samarium, europium, gadolinium, terbium, dysprosium, holmium, thulium, ytterbium, lutetium, scandium, or oxides thereof, or at least one non-rare earth metal dopant comprising zirconium or oxides thereof.

A method of fabricating a ceramic waveguide, include: reacting an organic precursor, at least one transition metal complex, and a plurality of rare-earth metal complexes to form a plurality of rare-earth doped crystalline nanoparticles; sintering the plurality of rare-earth doped nanoparticles to form a doped polycrystalline ceramic substrate; disposing a transition metal ceramic slurry over the doped polycrystalline ceramic substrate; and sintering the slurry to bond the transition metal ceramic to the doped polycrystalline ceramic substrate.

The plurality of rare-earth doped crystalline nanoparticles each comprise a diameter of 40 nm or less. The step of reacting comprises: providing an organic precursor solution; providing a metal salt solution comprising at least one transition metal complex and a plurality of rare-earth metal complexes; and mixing the organic precursor solution with the metal salt solution at a boiling point of a solvent in the metal salt solution to form a mixture. The step of reacting further comprises: filtering the mixture to form a plurality of amorphous nanoparticle precursors; annealing the plurality of amorphous nanoparticle precursors to form the plurality of rare-earth doped crystalline nanoparticles. In some examples, the organic precursor is urea, the at least one transition metal complex comprises yttrium, and the plurality of rare-earth metal complexes comprises erbium and at least one of: lanthanum, cerium, praseodymium, neodymium, promethium, samarium, europium, gadolinium, terbium, dysprosium, holmium, thulium, ytterbium, lutetium, scandium or oxides thereof.

The step of sintering the plurality of rare-earth doped nanoparticles comprises: a first cold isostatic pressing of the plurality of rare-earth doped crystalline nanoparticles into a pellet; sintering the pellet at a temperature of at least 1450° C.; and a second hot isostatic pressing of the pellet under inert atmosphere to form the doped polycrystalline ceramic substrate. The step of disposing comprises: spin coating or tape casting the transition metal ceramic slurry over the doped polycrystalline ceramic substrate to a thickness in a range of 100 µm to 1 cm. The step of sintering the slurry comprises: removing volatile material from the slurry to bond the transition metal ceramic to the doped polycrystalline ceramic substrate, wherein sintering decreases a thickness of the transition metal ceramic by at least 30%, as compared with a thickness of the disposed transition metal ceramic slurry. The volatile material includes at least one of solvent, binder, and plasticizer.

Co-doping $Er^{3+}$ $Y_2O_3$ ceramics with $La^{3+}$ or other rare-earth dopants disclosed herein increases the ceramic's optical refractive index without decreasing optical coherence lifetime of $Er^{3+}$ $^4I_{13/2}$-$^4I_{15/2}$ transitions. This enables fabrication of ceramic waveguide quantum memories in which the core is $La^{3+}$, $Er^{3+}$ co-doped $Y_2O_3$ and the cladding is pure $Y_2O_3$. Doping $Y_2O_3$ by 10% $La^{3+}$ is shown to increase the refractive index by 0.009, or 0.48% (Δn/n), which is sufficient to form waveguide devices. Moreover, solution synthesis of doped $Y_2O_3$ nanoparticles produces uniform dopant distributions, for both $Er^{3+}$ and $La^{3+}$. $Er^{3+}$, $La^{3+}$ co-doped $Y_2O_3$ nanoparticles may be sintered into transparent ceramics which have optical coherence lifetime close to that of $Er^{3+}$ doped $Y_2O_3$ single crystals.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As utilized herein, "optional," "optionally," or the like are intended to mean that the subsequently described event or circumstance can or cannot occur, and that the description includes instances where the event or circumstance occurs and instances where it does not occur. The indefinite article "a" or "an" and its corresponding definite article "the" as used herein means at least one, or one or more, unless specified otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A method of fabricating a ceramic waveguide, the method comprising:
    reacting an organic precursor, at least one transition metal complex, and a plurality of rare-earth metal complexes to form a plurality of rare-earth doped crystalline nanoparticles;
    sintering the plurality of rare-earth doped nanoparticles to form a doped polycrystalline ceramic substrate;
    disposing a transition metal ceramic slurry over the doped polycrystalline ceramic substrate; and
    sintering the slurry to bond the transition metal ceramic to the doped polycrystalline ceramic substrate.

2. The method of claim 1, wherein the plurality of rare-earth doped crystalline nanoparticles each comprise a diameter of 40 nm or less.

3. The method of claim 1, wherein the step of reacting comprises:
    providing an organic precursor solution;
    providing a metal salt solution comprising at least one transition metal complex and a plurality of rare-earth metal complexes; and
    mixing the organic precursor solution with the metal salt solution at a boiling point of a solvent in the metal salt solution to form a mixture.

4. The method of claim 3, wherein the step of reacting further comprises:
    filtering the mixture to form a plurality of amorphous nanoparticle precursors;
    annealing the plurality of amorphous nanoparticle precursors to form the plurality of rare-earth doped crystalline nanoparticles.

5. The method of claim 4, wherein:
the organic precursor is urea,
the at least one transition metal complex comprises yttrium, and
the plurality of rare-earth metal complexes comprises erbium and at least one of: lanthanum, cerium, praseodymium, neodymium, promethium, samarium, europium, gadolinium, terbium, dysprosium, holmium, thulium, ytterbium, lutetium, scandium or oxides thereof.

6. The method of claim 1, wherein the step of sintering the plurality of rare-earth doped nanoparticles comprises:
a first cold isostatic pressing of the plurality of rare-earth doped crystalline nanoparticles into a pellet;
sintering the pellet at a temperature of at least 1450° C.; and
a second hot isostatic pressing of the pellet under inert atmosphere to form the doped polycrystalline ceramic substrate.

7. The method of claim 1, wherein the step of disposing comprises:
spin coating or tape casting the transition metal ceramic slurry over the doped polycrystalline ceramic substrate to a thickness in a range of 100 μm to 1 cm.

8. The method of claim 1, wherein the step of sintering the slurry comprises:
removing volatile material from the slurry to bond the transition metal ceramic to the doped polycrystalline ceramic substrate,
wherein sintering decreases a thickness of the transition metal ceramic by at least 30%, as compared with a thickness of the disposed transition metal ceramic slurry.

9. The method of claim 8, wherein the volatile material includes at least one of solvent, binder, and plasticizer.

* * * * *